US00RE42004E

(19) United States
(12) Reissued Patent
Sugaya

(10) Patent Number: US RE42,004 E
(45) Date of Reissued Patent: Dec. 21, 2010

(54) METHOD FOR FABRICATING A SEMICONDUCTOR STORAGE DEVICE HAVING AN INCREASED DIELECTRIC FILM AREA

(76) Inventor: Fumitaka Sugaya, 3-3-20-303, Kamiaso, Aso-ku, Kawasaki, Kanagawa 215-0021 (JP)

(21) Appl. No.: 11/655,744

(22) Filed: Jan. 18, 2007

Related U.S. Patent Documents

Reissue of:
(64) Patent No.: 6,844,268
Issued: Jan. 18, 2005
Appl. No.: 09/387,857
Filed: Sep. 1, 1999

U.S. Applications:

(62) Division of application No. 09/059,590, filed on Apr. 14, 1998, now Pat. No. 6,288,423.

(30) Foreign Application Priority Data

Apr. 18, 1997 (JP) ..... 9-116322

(51) Int. Cl.
*H01L 21/461* (2006.01)

(52) U.S. Cl. ..... 438/742; 438/257; 438/396; 438/947

(58) Field of Classification Search ..... 438/253–255, 438/396–398, 593, 594, 669, 942, 945, 257, 438/742, 947
See application file for complete search history.

(56) References Cited

U.S. PATENT DOCUMENTS

| | | | |
|---|---|---|---|
| 4,570,331 | A | 2/1986 | Eaton, Jr. et al. |
| 4,763,177 | A | 8/1988 | Paterson |
| 5,084,405 | A | 1/1992 | Fazan et al. |
| 5,164,881 | A | 11/1992 | Ahn |
| 5,241,201 | A | 8/1993 | Matsuo et al. |
| 5,300,802 | A | 4/1994 | Komori et al. |
| 5,303,182 | A | 4/1994 | Nakao et al. |
| 5,440,161 | A | 8/1995 | Iwamatsu et al. |
| 5,553,018 | A | 9/1996 | Wang et al. |
| 5,629,540 | A | 5/1997 | Roh et al. |
| 5,641,989 | A | 6/1997 | Tomioka |
| 5,677,226 | A | 10/1997 | Ishitani |
| 5,714,779 | A | 2/1998 | Auer et al. |
| 5,766,993 | A | 6/1998 | Tseng |
| 5,892,257 | A | 4/1999 | Acocella et al. |
| 6,010,932 | A | 1/2000 | Schoenfeld et al. |

FOREIGN PATENT DOCUMENTS

| | | |
|---|---|---|
| JP | 60-239994 | 11/1985 |
| JP | 5-55605 | 1/1993 |
| JP | 5-055605 | 1/1993 |
| JP | 5-110107 | 4/1993 |
| JP | 5-243515 | 9/1993 |
| JP | 6-282992 | 10/1994 |
| JP | 7-201189 | 8/1995 |

OTHER PUBLICATIONS

Wolf, S., "Silicon Processing for the VLSI Era", vol. 2, pp. 65 and 203, 1990.
Wolf, S. and Tauber, R.N., "Silicon Processing for the VLSI Era", vol. 1, pp. 407–408, 1986.

*Primary Examiner*—Zandra V. Smith
*Assistant Examiner*—Christy L Novacek

(57) ABSTRACT

A semiconductor device of the present invention is a semiconductor memory having a charge storage film. Recesses or holes which effectively increase the capacitance of a floating gate or a memory cell capacitor are formed in the charge storage film. These recesses or holes are formed at the same time the floating gate electrode or the lower electrode of the capacitor is isolated into the form of islands. A dielectric film and a polysilicon film is formed on the isolated island floating gate electrodes or lower electrodes. These recesses or holes increase the surface area of the dielectric film and improve the write and erase characteristics of a memory cell.

33 Claims, 33 Drawing Sheets

METHOD FOR FABRICATING A SEMICONDUCTOR STORAGE DEVICE HAVING AN INCREASED DIELECTRIC FILM AREA

Matter enclosed in heavy brackets [ ] appears in the original patent but forms no part of this reissue specification; matter printed in italics indicates the additions made by reissue.

This application is a divisional of U.S. patent application Ser. No. 09/059,590 filed Apr. 4, 1998 now U.S. Pat. No. 6,288,423.

BACKGROUND OF THE INVENTION

1. Field of the Invention

The present invention relates to a semiconductor device including a memory cell having a composite gate structure or a semiconductor device including a stacked memory cell capacitor and a method of fabricating the same.

2. Description of the Related Art

Conventionally, several improvements have been made to improve the write and erase characteristics of a memory cell of an EEPROM or the like having a floating gate structure or a memory cell capacitor.

As an example, in prior art disclosed in Japanese Patent Laid-Open No. 5-110107, at least a portion of a polysilicon film as a floating gate electrode is formed by CVD under conditions by which a larger number of fine undulations are formed on the surface of the floating gate electrode, and an insulating interlayer and a control gate electrode are formed along the undulations on the surface of the floating gate electrode.

These fine undulations increase the capacitance between the floating gate electrode and a control gate electrode. When voltage drop in which the voltage applied to the control gate electrode decreases occurs, these undulations efficiently act on the floating gate electrode to improve the write and erase characteristics.

Also, in prior art disclosed in Japanese Patent Laid-Open No. 5-55605, a recess is formed in substantially the center of a floating gate electrode to increase the capacitance between the floating gate electrode and a control gate electrode. Consequently, an effect similar to the effect of the above prior art is achieved.

The capacitance of a memory cell capacitor can also be increased by forming undulations on the surface of a lower electrode.

For example, Japanese Patent Laid-Open No. 5-243515 has described a method of increasing the charge storage amount by forming a rectangular or cylindrical trench in a lower electrode of a stacked memory cell capacitor.

Unfortunately, the above-mentioned prior arts have the following problems.

First, in the prior art disclosed in Japanese Patent Laid-Open No. 5-110107, the fine undulations on the floating gate electrode are formed under specific conditions by CVD. Therefore, the fabrication steps are complicated to set the CVD conditions. Additionally, since these undulations are very fine, the effect of increasing the capacitance is not satisfactory.

In the prior art disclosed in Japanese Patent Laid-Open No. 5-55605, the recess is formed in substantially the center of the floating gate electrode after a polysilicon film serving as the floating gate electrode is formed. Therefore, it is unavoidable to complicate the fabrication steps and increase the number of the fabrication steps. Also, the end point of etching for forming the recess is difficult to determine. Accordingly, the recess may sometimes extend through the polysilicon film to separate the floating gate electrode.

In the prior art of a capacitor disclosed in Japanese Patent Laid-Open No. 5-243515, the trench is formed by etching after stacked polysilicon serving as the lower electrode is formed. Accordingly, the fabrication steps are complicated and the number of the fabrication steps is increased. Furthermore, the end point of the etching cannot be easily determined.

SUMMARY OF THE INVENTION

It is an object of the present invention to provide a semiconductor device which includes a composite gate structure memory cell or a stacked memory cell capacitor, effectively increases the capacitance of the floating gate electrode or the memory cell capacitor, and has high reliability, and a simple method of fabricating this semiconductor device.

A semiconductor device of the present invention is a semiconductor device including an element active region defined by forming an element isolation structure on a semiconductor substrate, comprising an island-like charge storage film formed across the element isolation structure and the element active region so as to be formed on the element active region through an insulating film, the charge storage film having a recess in a surface on the element active region and a hole formed on the element isolation structure to reach the element isolation structure, a dielectric film so formed as to cover the surface of the charge storage film including inner surfaces of the hole, and a conductive film formed on the dielectric film and capacitively coupled with the charge storage film.

Another aspect of the semiconductor device of the present invention is a semiconductor device including an element active region defined by forming an element isolation structure on a semiconductor substrate, comprising an island-like charge storage film formed across the element isolation structure and the element active region so as to be formed on the element active region through an insulating film, the charge storage film having a recess in a surface on the element active region and a hole formed on the element isolation structure to reach the element isolation structure, and a conductive film formed on the charge storage film.

Still another aspect of the semiconductor device of the present invention is a semiconductor device including an element active region defined by forming an element isolation structure on a semiconductor substrate and having a transistor constituted by a gate electrode and a pair of impurity diffusion layers in the element active region, comprising an insulating interlayer formed on the semiconductor substrate including the transistor, a first hole formed in the insulating interlayer and having a surface layer of the impurity diffusion layer as a bottom surface, an island-like charge storage film electrically connected to one of the impurity diffusion layers through the first hole, a second hole formed in the charge storage film and having a surface layer of the insulating interlayer as a bottom surface, a dielectric film so formed as to cover a surface of the charge storage film including inner surfaces of the second hole, and a conductive film formed on the dielectric film and capacitively coupled with the charge storage film, wherein the charge storage film, the dielectric film, and the conductive film constitute a capacitor.

Still another aspect of the semiconductor device of the present invention is a semiconductor device including an element active region defined by forming an element isolation structure on a semiconductor substrate, comprising an insulating film formed on the semiconductor substrate in the element active region, and a charge storage film patterned on the insulating film, wherein the charge storage film is formed across the element isolation structure and has a hole on the element isolation structure, and at least a portion of a bottom surface of the hole reaches a surface layer of the element isolation structure.

Still another aspect of the semiconductor device of the present invention is a semiconductor device including a plurality of element isolation regions defined by forming an element isolation structure on a semiconductor substrate, comprising an island-like charge storage film formed across the element isolation structure and the element active regions and having a recess, a dielectric film so formed as to cover a surface of the charge storage film, and a conductive film formed on the dielectric film and capacitively coupled with the charge storage film, wherein the charge storage film is formed in each of the element active regions, and an upper surface of each of the charge storage films is planarized by CMP and flush with an upper surface of an adjacent charge storage film.

A method of fabricating a semiconductor device according to the present invention comprises the first step of defining an element active region by forming an element isolation structure on a semiconductor substrate, the second step of forming an insulating film on the semiconductor substrate in the element active region, the third step of forming a first conductive film on an entire surface of the semiconductor substrate including the insulating film and the element isolation structure, the fourth step of forming a mask pattern having first and second openings on the first conductive film, the fifth step of etching the first conductive film until the element isolation structure is exposed in the first opening by using the mask pattern as a mask, thereby dividing the first conductive film, and simultaneously forming a recess in the second opening having the first conductive film on a bottom of the recess, the sixth step of forming a dielectric film so as to cover a surface of the first conductive film, and the seventh step of forming a second conductive film on the dielectric film opposite the first conductive film and separated by the dielectric film.

Another aspect of the method of fabricating a semiconductor device according to the present invention comprises the first step of defining an element active region by forming an element isolation structure on a semiconductor substrate, the second step of forming a gate insulating film and a gate electrode in the element active region, the third step of doping an impurity into the second substrate to form a pair of impurity diffusion layers in surface regions of the semiconductor substrate on two sides of the gate electrode, the fourth step of forming a first conductive film electrically connected to one of the impurity diffusion layers, the fifth step of forming a mask pattern having at least first and second openings on the first conductive film, the sixth step of etching the first conductive film by using the mask pattern as a mask, thereby dividing the first conductive film in the first opening, and simultaneously forming a recess in the second opening where the first conductive film is on a bottom of the recess, the seventh step of forming a dielectric film so as to cover a surface of the first conductive film, and the eighth step of forming a second conductive film on the dielectric film opposite the second conductive film and separated by the dielectric film.

Still another aspect of the method of fabricating a semiconductor device according to the present invention comprises the first step of forming a first conductive film in an insulating film region on a semiconductor substrate, the second step of forming a mask pattern having two types of openings on the first conductive film, the third step of etching the first conductive film by using the mask pattern as a mask, thereby dividing the first conductive film conforming to a shape of one of the openings, and simultaneously forming at least one recess in a surface of the divided first conductive film conforming to a shape of the other opening, the fourth step of forming an insulating film so as to cover a surface of the first conductive film, and the fifth step of forming a second conductive film so as to cover a surface of the insulating film and opposing the second conductive film to the first conductive film through the insulating film.

Still another aspect of the method of fabricating a semiconductor device according to the present invention comprises the first step of defining an element active region by forming an element isolation structure on a semiconductor substrate, the second step of forming an insulating film on the semiconductor substrate in the element active region, the third step of forming a first conductive film on an entire surface including the insulating film and the element isolation structure, the fourth step of forming a mask pattern having at least first and second openings on the first conductive film, the fifth step of etching the first conductive film until the element isolation structure is exposed in the first and second openings by using the mask pattern as a mask, thereby dividing the first conductive film below the first opening, and simultaneously forming a hole extending through the first conductive film below the second opening, the sixth step of forming a dielectric film so as to cover the first conductive film, and the seventh step of forming a second conductive film on the dielectric film opposite the first conductive film and separated by the dielectric film.

Still another aspect of the method of fabricating a semiconductor device according to the present invention comprises the first step of defining an element active region by forming an element isolation structure on a semiconductor substrate, the second step of forming a gate oxide film and a gate electrode on the semiconductor substrate in the element active region, the third step of doping an impurity into the semiconductor substrate in the element active region to form a pair of impurity diffusion layers in surface regions of the semiconductor substrate on two sides of the gate electrode, the fourth step of forming a first conductive film electrically connected to one of the impurity diffusion layers, the fifth step of forming a mask pattern having at least first and second openings on the first conductive film, the sixth step of etching the first conductive film by using the mask pattern as a mask, thereby dividing the first conductive film below the first opening, and simultaneously forming a hole extending through the first conductive film below the second opening, the seventh step of forming a dielectric film so as to cover a surface of the first conductive film, and the eighth step of forming a second conductive film so as to cover the dielectric film and opposing the second conductive film to the first conductive film through the dielectric film.

In the semiconductor device of the present invention, a recess or a hole is formed in the charge storage film. Therefore, the area of the dielectric film can be increased to increase the charge storage amount. Especially when a hole is formed, the charge storage film and the conductive film can be opposite to each other and separated by the dielectric film within the range from the lower surface to the upper surface of the hole. Consequently, the charge storage amount can be effectively increased.

In the method of fabricating a semiconductor device of the present invention, the first conductive film (charge storage film) is divided by etching along the first opening in a mask pattern. At the same time, a recess or hole can be formed by self-alignment along the second opening in the mask pattern.

By setting the width of the first opening to be twice or more the width of the second opening, it is possible to decrease the etching rate in the second opening by a microloading effect and reliably form the recess without dividing the first conductive film.

Also, when the first conductive film is formed across the step between the element isolation structure and the element active region, the first conductive film is etched after its surface is planarized by polishing. Accordingly, even when etching is performed until the element isolation structure is exposed along the first opening, a recess can be formed without dividing the first conductive film in the second opening formed above the element active region.

When a hole is to be formed in the first conductive film, the first conductive film is etched until the underlying stacked film is exposed in the first and second openings. Consequently, it is possible to divide the first conductive film along the first opening and form a hole along the second opening.

The present invention can provide a semiconductor device which includes a composite gate structure memory cell or a stacked memory cell capacitor and in which the capacitance of the floating gate or the memory cell capacitor is effectively increased, and a method of stably and reliably fabricating this semiconductor device.

Accordingly, the present invention contributes to further development of these semiconductor devices.

DETAILED DESCRIPTION OF THE PREFERRED EMBODIMENTS

First Embodiment

The arrangement of a memory cell of an EEPROM according to the first embodiment of the present invention and a method of fabricating the same will be described below. FIGS. 1A to 1G and 2A to 2J are side sectional views showing the fabrication steps of the EEPROM memory cell according to the first embodiment. FIG. 3 is a schematic plan view showing a memory cell region of the EEPROM. A section I—I in FIG. 3 corresponds to FIGS. 1A to 1G; and a section II—II, to FIGS. 2A to 2J.

First, the surface of a p-type silicon semiconductor substrate 1 is selectively oxidized by a so-called LOCOS process to form a field oxide film 2. Consequently, element isolation is achieved on the p-type silicon semiconductor substrate 1 to define element formation regions 3.

Figure 1A:
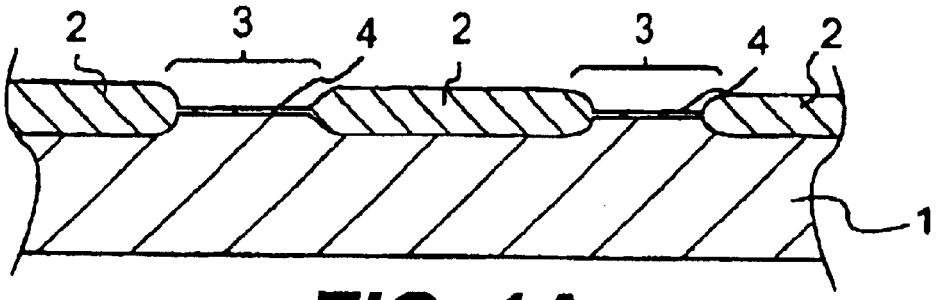
FIGS. 1A to 1G are schematic sectional views showing a method of fabricating an EEPROM according to the first embodiment in order of steps.
Figure 2A:
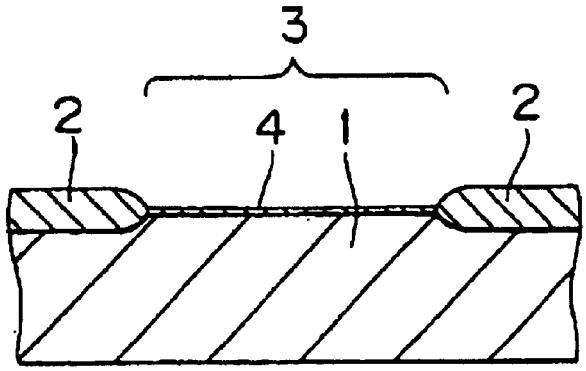
FIGS. 2A to 2J are schematic sectional views showing the method of fabricating the EEPROM according to the first embodiment in order of steps.
Figure 2B:
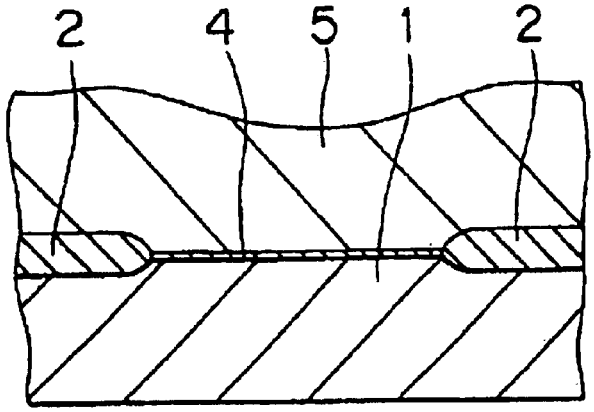
Figure 2C:
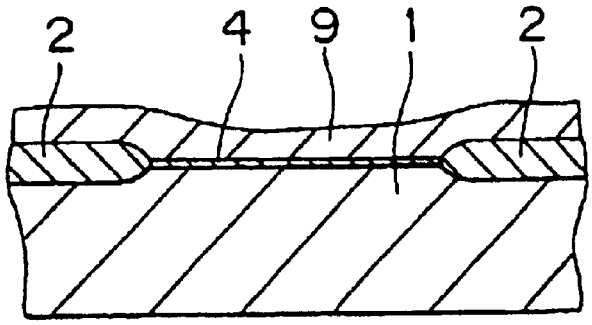

Subsequently, the element formation regions on the p-type silicon semiconductor substrate 1 are thermally oxidized to form a tunnel oxide film 4 having a thickness of about 100 Å, thereby obtaining the state shown in FIGS. 1A and 2A. Thereafter, a polysilicon film 5 having a thickness of about 5,000 Å is formed on the entire surface of the field oxide film 2 and the tunnel oxide film 4 by adding a dopant gas by low-pressure CVD. Alternatively, an undoped polysilicon film 5 may be formed and given conductivity by ion-implanting an impurity such as arsenic. This state is shown in FIG. 2B.

Figure 1B:
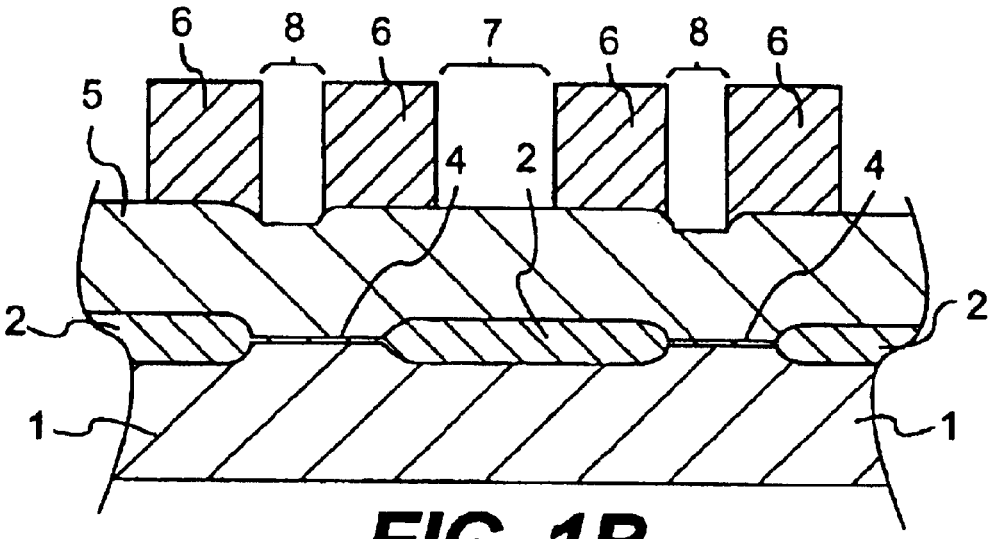

Next, a photoresist 6 is formed on the polysilicon film 5 by photolithography. In this photolithography, as shown in FIG. 1B, a photoresist opening 7 is formed by forming an opening about 0.6 μm wide in a region for isolating floating gate electrodes 9 to be formed later. Also, photoresist openings 8 are formed by forming openings about 0.25 μm wide in regions corresponding to substantially the center of the width of the tunnel oxide film 4.

By using the photoresist 6 as a mask, the polysilicon film 5 is selectively removed by dry etching until the surface of the field oxide film 2 below the photoresist opening 7 is exposed. Since the width of the photoresist openings 8 is smaller than the half width of the photoresist opening 7, the supply of the etchant is reduced by a microloading effect when the polysilicon film 5 exposed in the photoresist openings 8 is etched. As a consequence, the etching rate is decreased in these portions.

That is, the progress in etching the polysilicon film 5 exposed in the photoresist opening 7 is faster than the progress in etching the polysilicon film 5 exposed in the photoresist openings 8. Accordingly, the polysilicon film 5 exposed in the photoresist opening 7 is removed first, and the underlying field oxide film 2 is exposed.

Figure 1C:
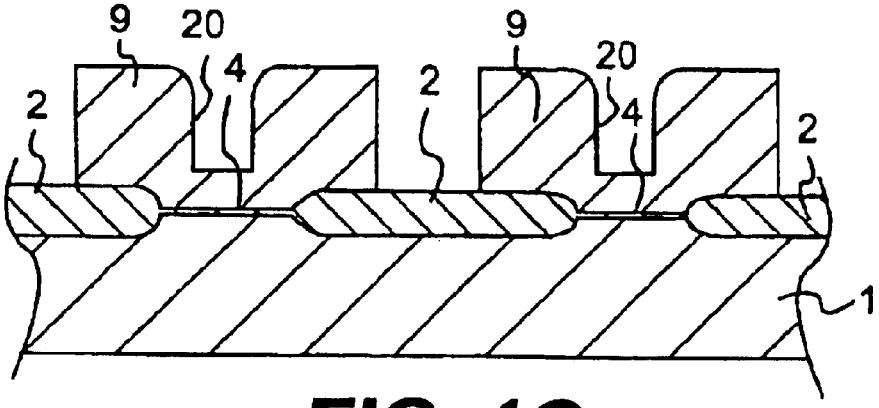

The dry etching is stopped when the field oxide film 2 is exposed in the photoresist opening 7. Consequently, the polysilicon film 5 is separated in the position of the photoresist opening 7, forming the floating gate electrodes 9. In the positions of the photoresist openings 8, the polysilicon film 5 remains on the bottom surfaces to form recesses 20 on the floating gate electrodes 9. This state is shown in FIGS. 1C and 2C.

Figure 1D:
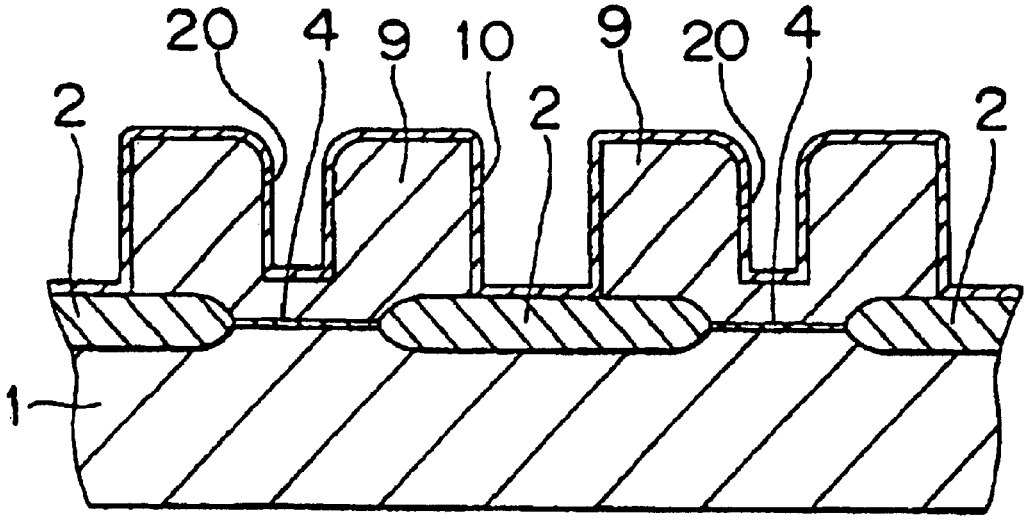
Figure 2D:
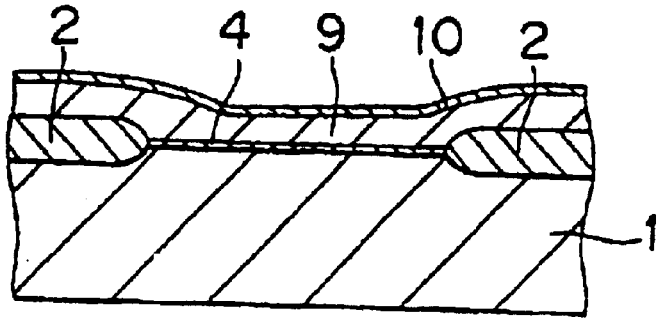
Figure 3:
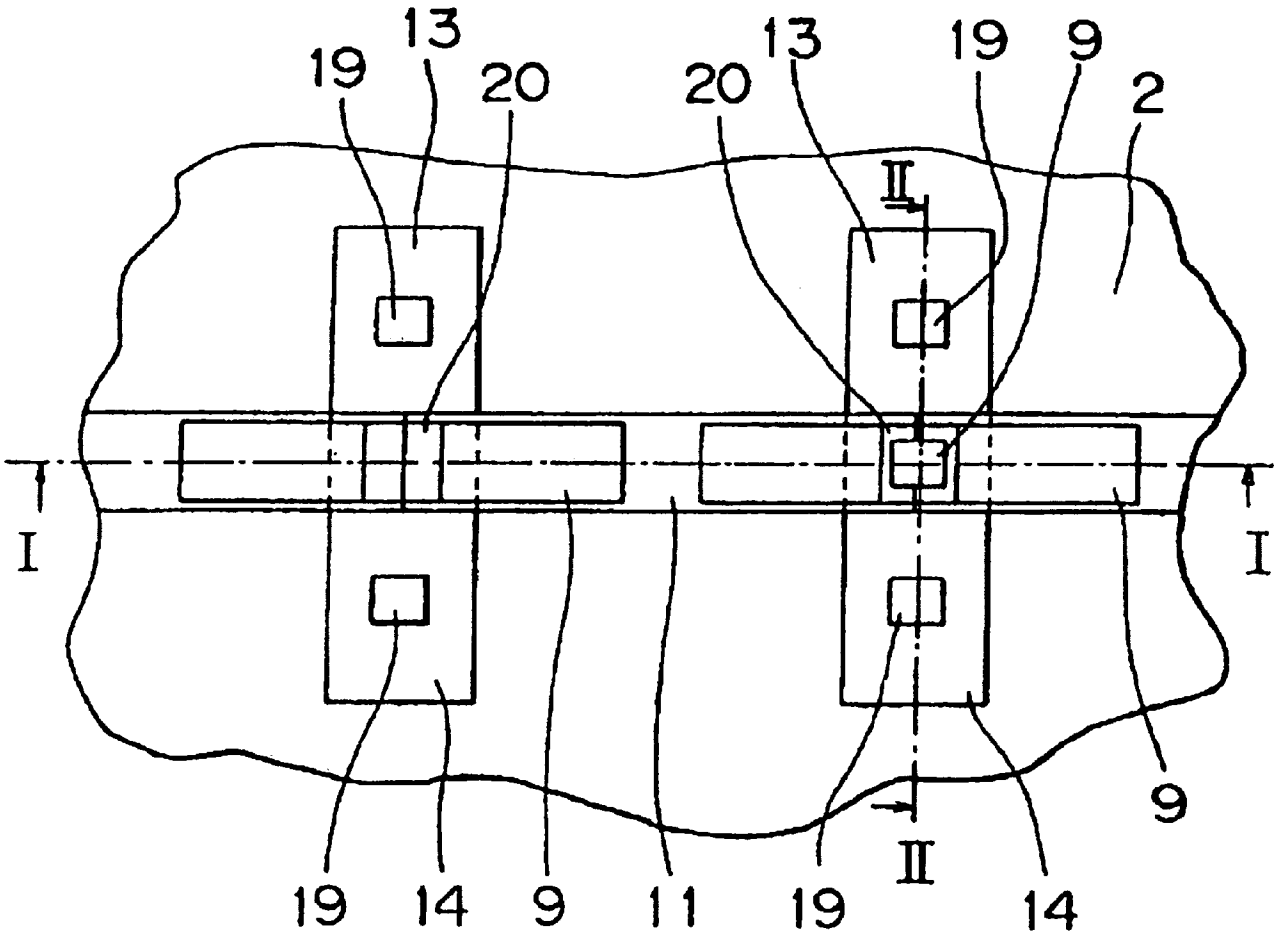
FIG. 3 is a schematic plan view showing the EEPROM according to the first embodiment.

Subsequently, as shown in FIGS. 1D and 2D, a silicon oxide film about 50 Å thick, a silicon nitride film about 40 Å thick, and a silicon oxide film about 50 Å thick are deposited in this order on the entire surface by LPCVD, thereby forming a dielectric film 10 made from an ONO film.

Figure 1E:
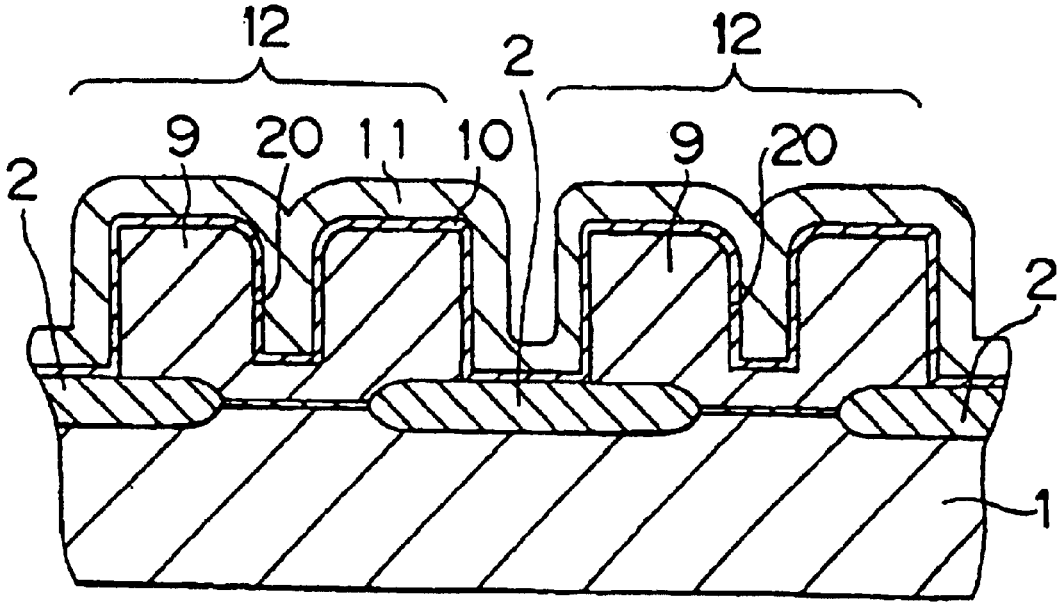
Figure 2E:
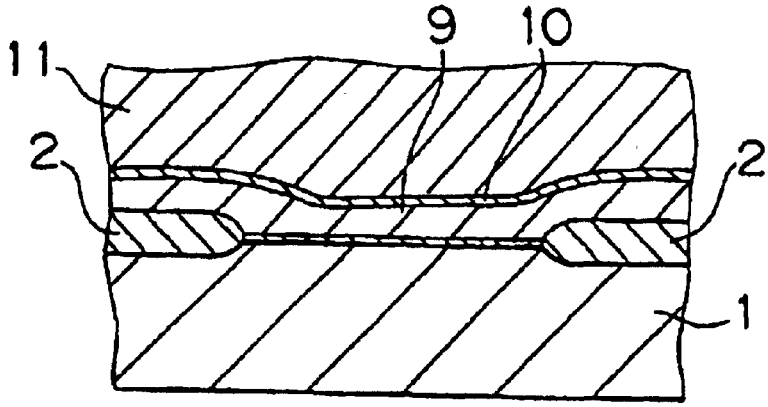
Figure 2F:
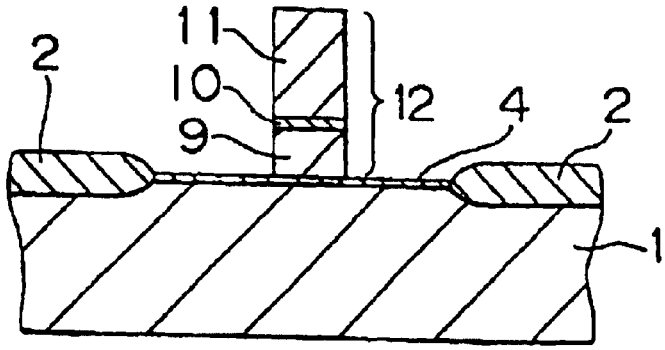
Figure 2G:
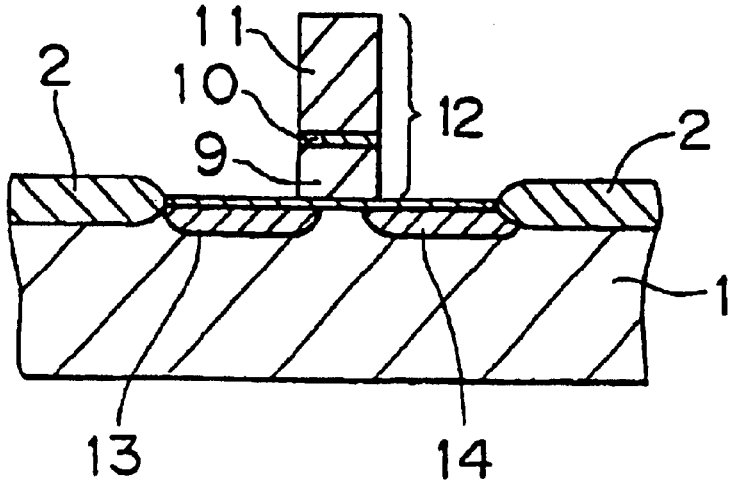

As shown in FIGS. 1E and 2E, a polysilicon film 11 having a thickness of about 1,500 Å is formed on the dielectric film 10 by CVD and patterned together with the floating gate electrodes 9 and the dielectric film 10, thereby completing composite gate electrodes 12. This state is shown in FIGS. 1E and 2F. The floating gate electrodes 9 have the function of a charge storage film which stores electric charge in accordance with the voltage applied to the polysilicon film 11.

By using the composite gate electrodes 12 as masks, arsenic is ion-implanted into the surface region of the p-type silicon semiconductor substrate 1 to form a source region 13 and a drain region 14 as n-type impurity diffusion layers. Appropriate ion-implantation conditions are an acceleration energy of about 70 kev and a dose of about $5\times10^{15}/cm^2$. Thereafter, annealing is performed at 900° C. for about 30 min to activate the implanted arsenic, obtaining the state shown in FIG. 2G.

Figure 2H:
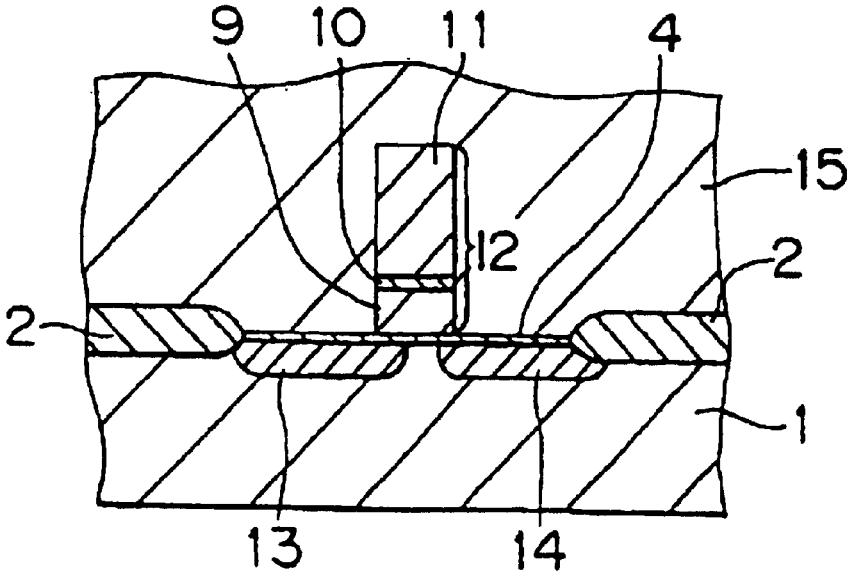
Figure 2I:
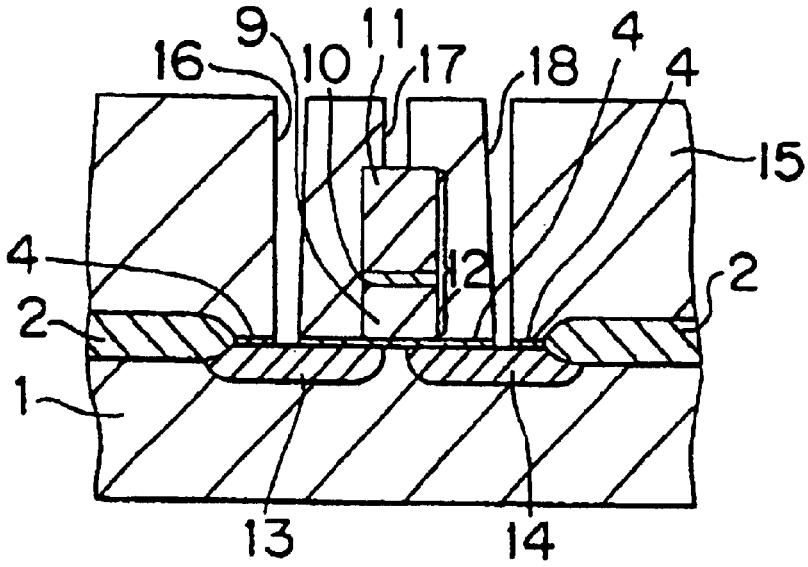

Next, as shown in FIG. 2H, a BPSG film 15 as an insulating interlayer is deposited on the entire surface by CVD, and the surface is planarized by reflow. Thereafter, contact holes 16, 17, and 18 are formed in the BPSG film 15 to expose portions of the source region 13, the polysilicon film 11, and the drain region 14, respectively. The result is the state shown in FIG. 2I.

Figure 1F:
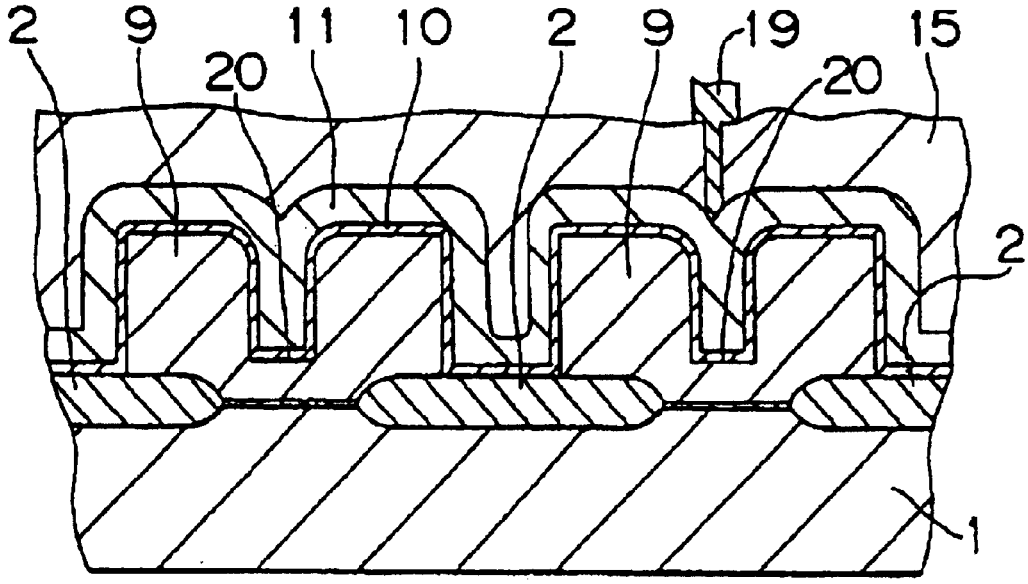
Figure 2J:
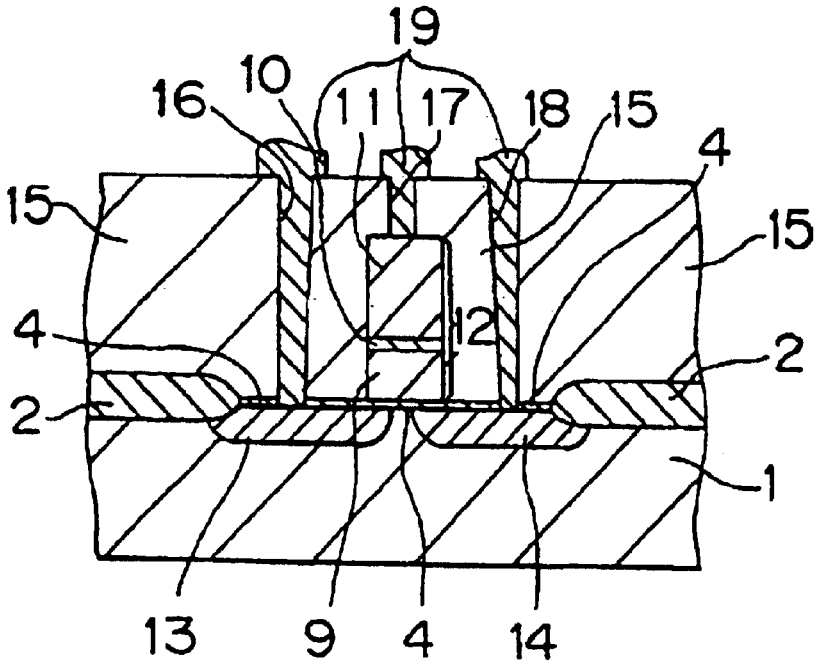

After an aluminum alloy film 19 is deposited by sputtering to bury the contact holes 16, 17, and 18, a wiring pattern is formed by photolithography and subsequent dry etching to complete a memory cell of an EEPROM as shown in FIGS. 1F, 2J, and 3.

Note that the element formation regions 3 defined in the first step can also be defined by a method other than LOCOS. When the regions are to be defined by a so-called field shield structure, a shield gate oxide film is first formed on the p-type semiconductor substrate 1, and a thin polysilicon film and a CVD oxide film are formed in this order on top of the shield gate oxide film.

Figure 1G:
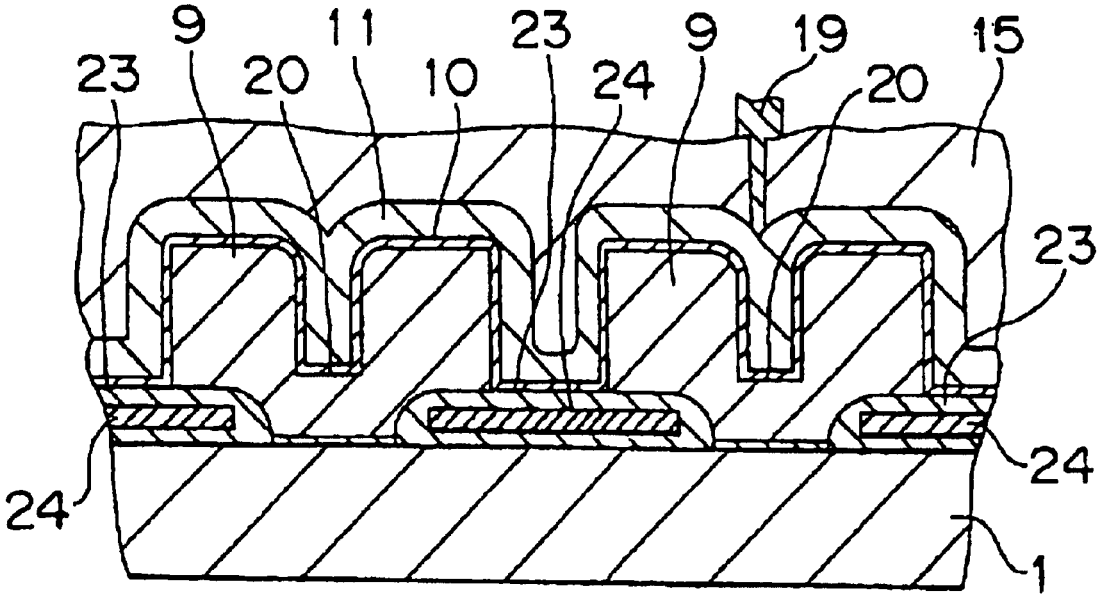

Subsequently, patterning is performed to remove the above stacked structure except for portions serving as the element isolation regions. Thereafter, a CVD oxide film is formed, and anisotropic etching is performed to leave this CVD oxide film only on the side walls of the patterned stacked structure described above, thereby forming the element isolation regions. FIG. 1G shows a memory cell of an EEPROM having a field shield element isolation structure thus formed. In FIG. 1G, a thin polysilicon film 24 covered with a CVD oxide film 23 is equivalent to a shield plate electrode.

It is also possible to define element active regions by a trench element isolation structure formed by burying an insulating film in a trench formed in a semiconductor substrate.

In the first embodiment as described above, in separating the adjacent floating gate electrodes 9 of a memory cell of an EEPROM, the width of the photoresist openings 8 is made smaller than the half width of the photoresist opening 7. Consequently, even when the polysilicon film 5 exposed in the photoresist opening 7 is etched away to expose the underlying field oxide film 2, the polysilicon film 5 is left behind on the bottom surfaces of the photoresist openings 8 by the microloading effect, forming the recesses 20 in these portions.

Since etching is stopped when the field oxide film 2 is exposed, the bottom surfaces of the recesses 20 are reliably positioned above the surface of the field oxide film 2 by the microloading effect. This prevents the polysilicon film 5 from being divided by the recesses 20. Accordingly, the floating gate electrodes 9 having the recesses 20 can be stably formed.

Also, the recesses 20 are formed by self-alignment at the same time the floating gate electrodes 9 are separated. Therefore, the recesses 20 can be formed without increasing the number of fabrication steps.

In the composite gate electrode 12 including the floating gate electrode 9 having the recess 20, the dielectric film 10 made from an ONO film, and the polysilicon film 11, the capacitance of the dielectric film 10 is increased by the recess 20. As a consequence, the write and erase characteristics of the memory cell can be improved.

Modifications

Figure 4A:
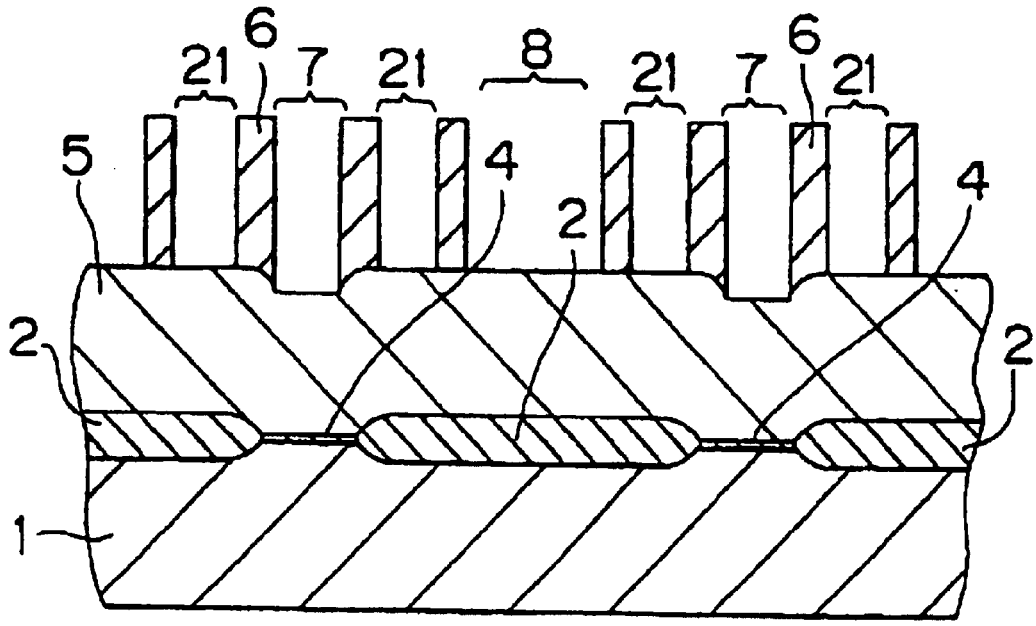
FIGS. 4A to 4C are schematic sectional views showing a method of fabricating an EEPROM according to a modification of the first embodiment in order of steps.
Figure 4B:
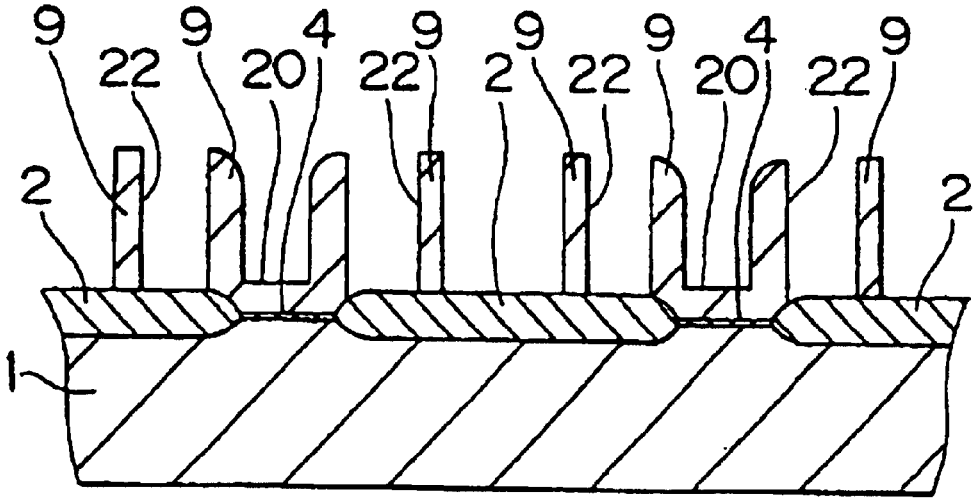
Figure 4C:
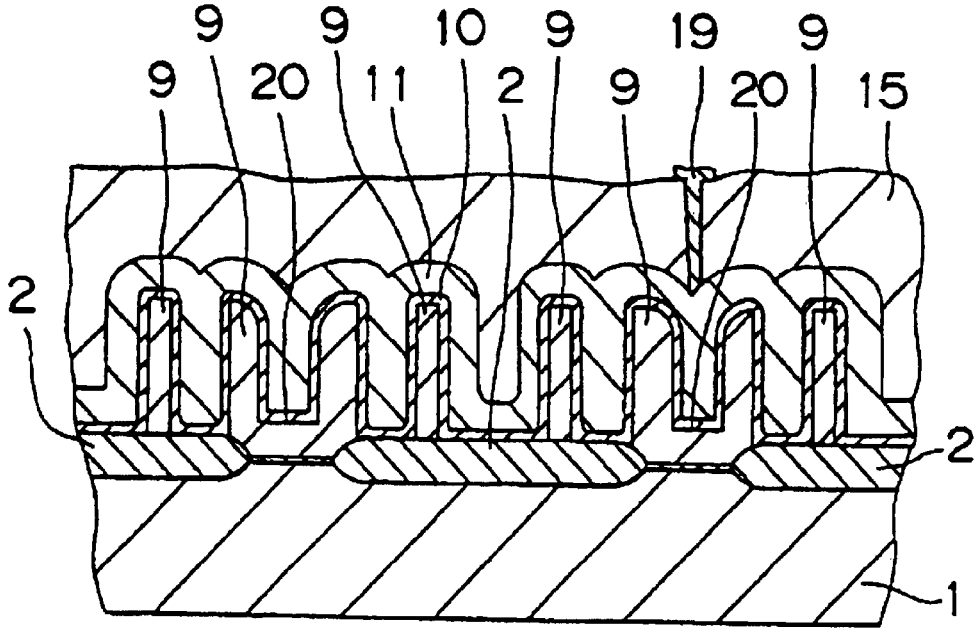
Figure 5:
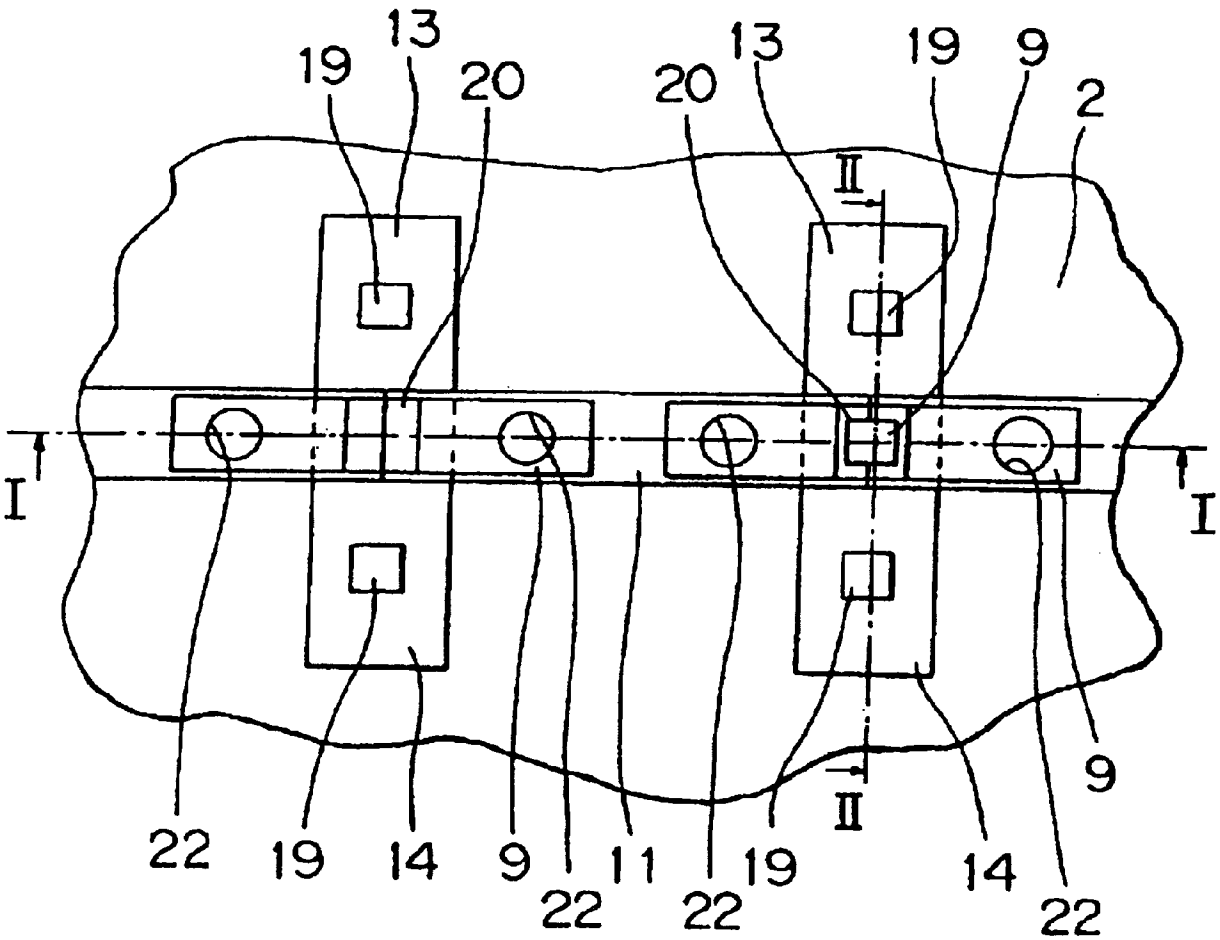
FIG. 5 is a schematic plan view showing the EEPROM according to the modification of the first embodiment shown in FIGS. 4A to 4C.

A modification of the first embodiment will be described below. FIGS. 4A to 4C are side sectional views showing the steps in fabricating a memory cell of an EEPROM according to this modification. FIG. 5 is a schematic plan view showing a memory cell region of this EEPROM. A section I—I in FIG. 5 corresponds to FIGS. 4A to 4C. The same reference numerals as in the EEPROM of the first embodiment denote the same parts, and a detailed description thereof will be omitted.

FIG. 4A corresponds to the step shown in FIG. 1B of the first embodiment. In this modification, the steps up to the state shown in FIG. 4A are the same as in the first embodiment. As shown in FIG. 4A, the number of openings in the photoresist 6 formed on the polysilicon film 5 is larger than in the first embodiment.

That is, as shown in FIG. 4A, substantially cylindrical photoresist openings 21 are formed between the photoresist openings 7 and the photoresist opening 8 in this modification.

By using this photoresist 6 as a mask, the polysilicon film 5 is selectively removed by dry etching. The etching is performed until the underlying field oxide film 2 is exposed in the photoresist opening 8 and the photoresist openings 21. Consequently, as shown in FIG. 4B, substantially cylindrical openings 22 are formed, and the recesses 20 are formed in the photoresist openings 7.

Thereafter, as in the first embodiment, the dielectric film 10 made from an ONO film is formed on the entire surface. The polysilicon film 11 is then formed by CVD and patterned to form the composite gate electrodes 12.

As in the first embodiment, arsenic is ion-implanted to form the source and drain regions 13 and 14 (not shown), the BPSG film 15 is deposited and subjected to reflow, the contact holes 16, 17, and 18 are formed, and the aluminum alloy film 19 is deposited and patterned to complete a memory cell of an EEPROM as shown in FIGS. 4C and 5.

In the memory cell of the EEPROM according to the modification with the above arrangement, the substantially cylindrical openings 22 are additionally formed on the floating gate electrodes 9. Accordingly, the capacitance of the dielectric film 10 can be further increased compared to the first embodiment. As a consequence, the write and erase characteristics of the memory cell can be further improved.

Note that the etching rate controlled by the microloading effect can be increased or decreased by properly changing the diameter of the photoresist openings 21 in the above modification. For example, the diameter may be made smaller than in the above modification to set the same etching rate as the photoresist openings 7, and the polysilicon film 5 may be removed to the extent to which the underlying field oxide film 2 is not exposed.

Figure 6A:
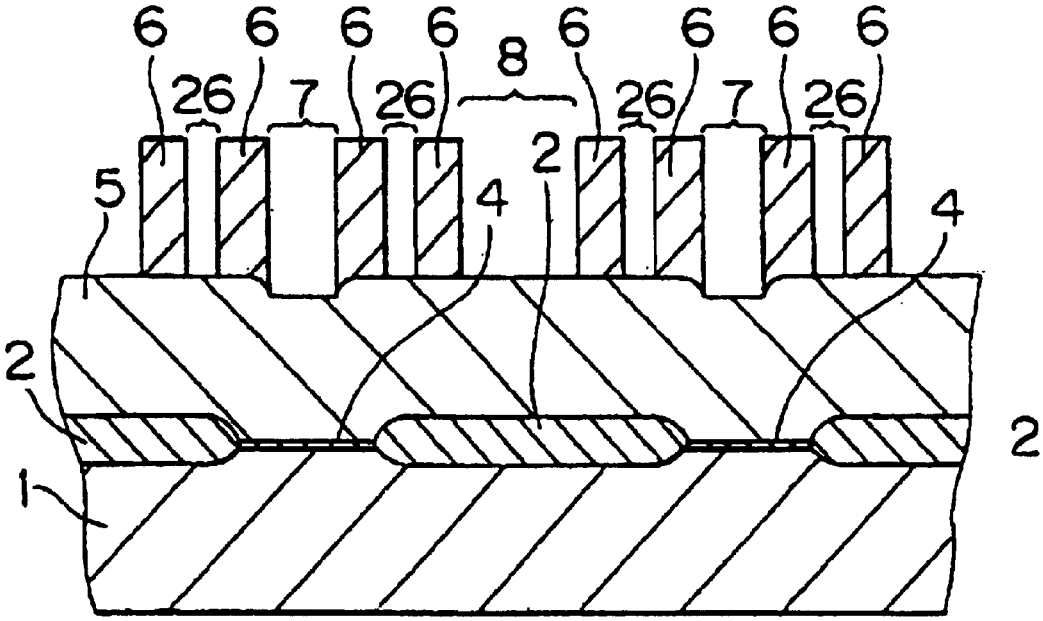
FIGS. 6A to 6C are schematic views showing a method of fabricating an EEPROM according to another modification of the first embodiment in order of steps.

If this is the case, in the step shown in FIG. 4A, substantially cylindrical photoresist openings 26 having a smaller diameter are formed between the photoresist openings 7 and 8 as shown in FIG. 6A.

Figure 6B:
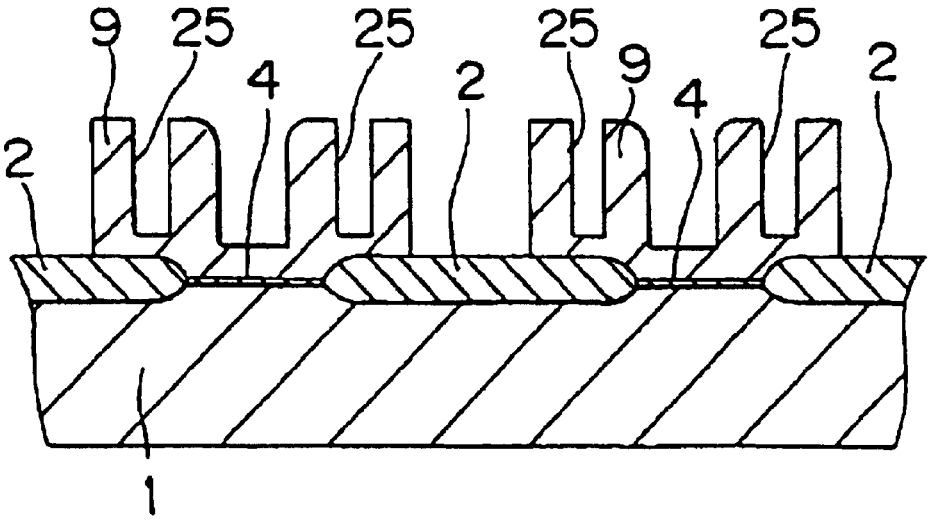

By using this photoresist 6 as a mask, the polysilicon film 5 is selectively removed by dry etching. In this etching, the polysilicon film 5 exposed in the photoresist openings 26 is also removed to form substantially cylindrical recesses 25 as shown in FIG. 6B.

After the dielectric film 10 made from an ONO film is formed on the entire surface, the polysilicon film 11 is formed by CVD and patterned to form the composite gate electrodes 12.

Figure 6C:
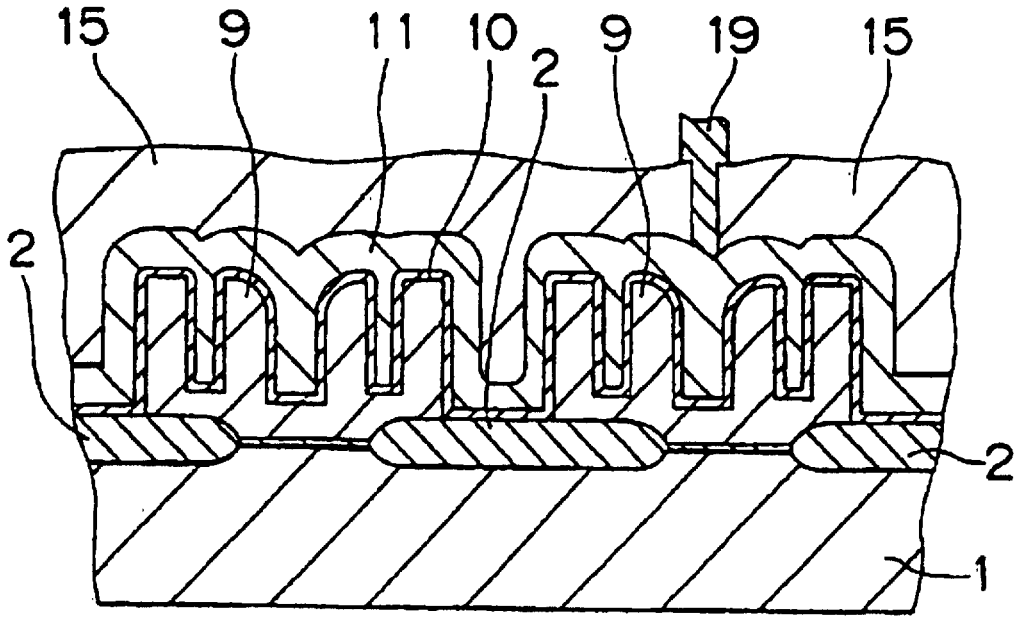
Figure 7:
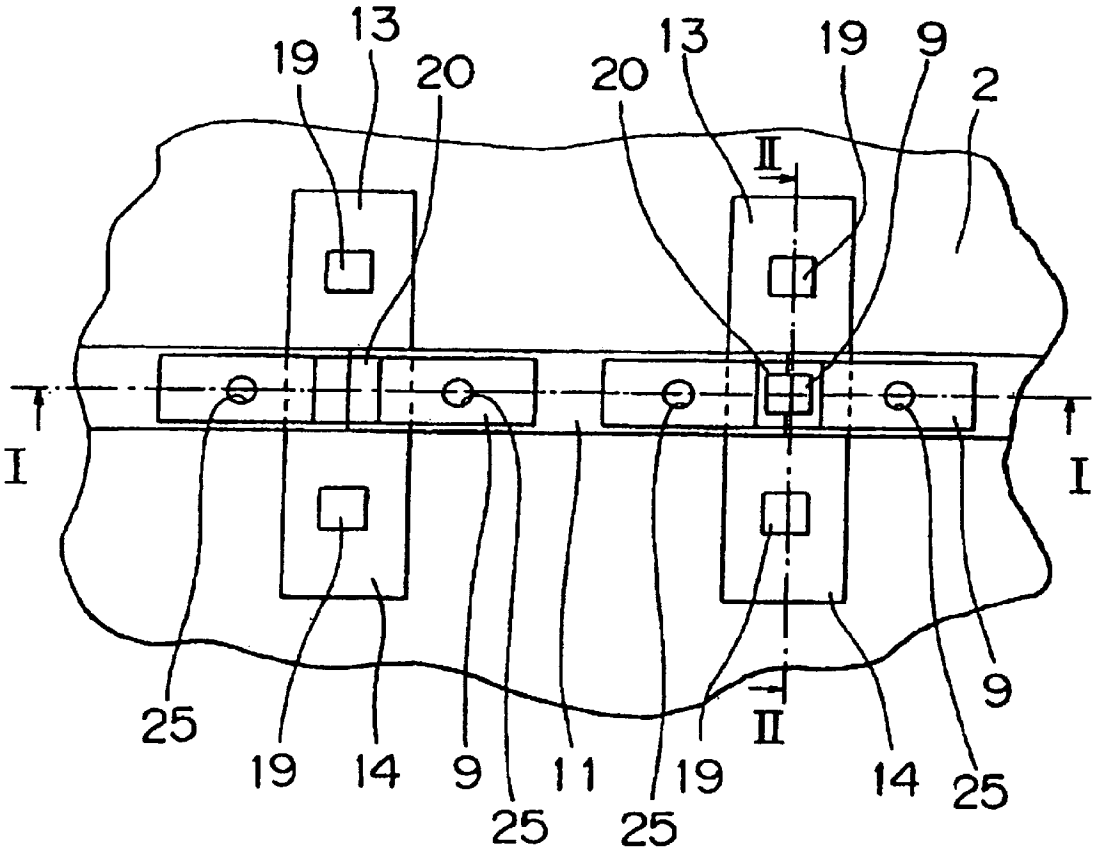
FIG. 7 is a schematic view showing the EEPROM according to the modification of the first embodiment shown in FIGS. 6A to 6C.

Thereafter, arsenic is ion-implanted to form the source and drain regions 13 and 14, the BPSG film 15 is deposited on the entire surface and subjected to reflow, the contact holes 16, 17, and 18 are formed, and the aluminum alloy film 19 is deposited and patterned to complete a memory cell of an EEPROM as shown in FIG. 6C and the schematic plan view of FIG. 7.

As described above, even when the recesses 25 are formed by giving the microloading effect to the photoresist openings 26 by decreasing the diameter of the photoresist openings 26, the capacitance of the dielectric film 10 can be increased compared to the first embodiment. Consequently, the write and erase characteristics of the memory cell can be improved.

Second Embodiment

The arrangement of an EEPROM according to the second embodiment of the present invention and a method of fabricating the same will be described below. FIGS. 8A to 8D are side sectional views showing the steps in fabricating a memory cell of the EEPROM according to the second embodiment. FIG. 9 is a schematic plan view showing a memory cell region of this EEPROM. A section I—I in FIG. 9 corresponds to FIGS. 8A to 8D. The same reference numerals as in the EEPROM of the first embodiment denote the same parts, and a detailed description thereof will be omitted.

This second embodiment differs from the first embodiment in that after a polysilicon film 5 is formed, the surface of the polysilicon film 5 is planarized by chemical mechanical polishing (CMP) before the step of forming a photoresist 6.

Figure 8A:
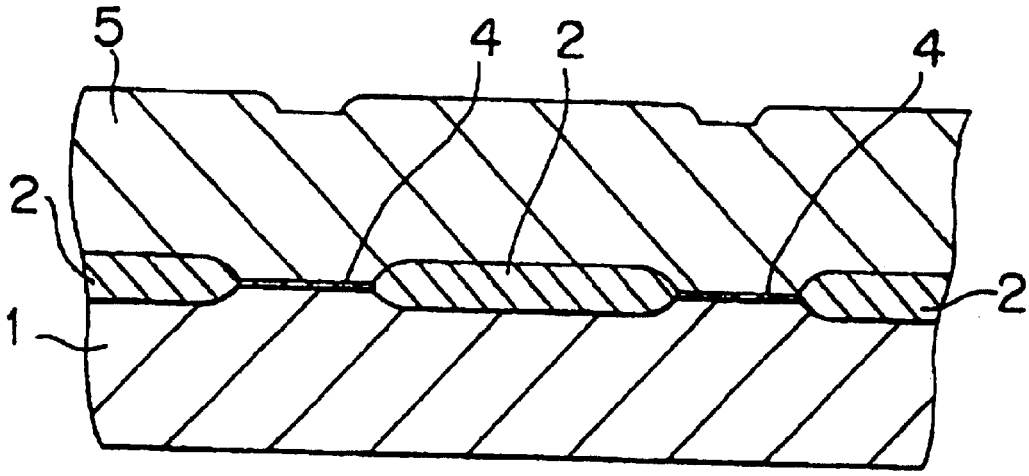
FIGS. 8A to 8D are schematic sectional views showing a method of fabricating an EEPROM according to the second embodiment in order of steps.
Figure 9:
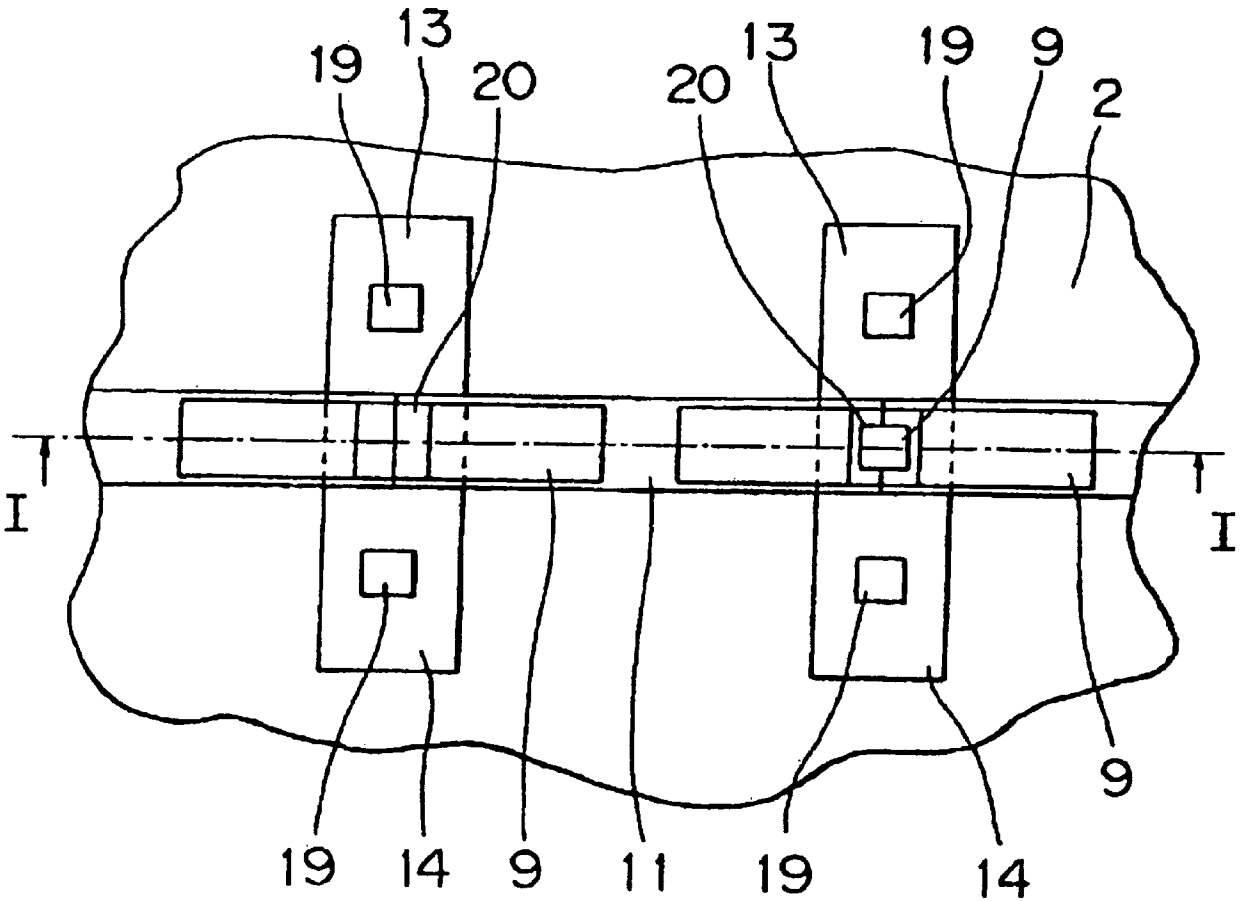
FIG. 9 is a schematic plan view showing the EEPROM according to the second embodiment.

FIG. 8A is a view corresponding to the step shown in FIG. 2B of the first embodiment. Referring to FIG. 8A, the polysilicon film 5 having a thickness of about 1,000 Å is formed by LPCVD on a field oxide film 2 and a gate oxide film 4. The steps up to the state shown in FIG. 8A are the same as in the first embodiment.

Figure 8B:
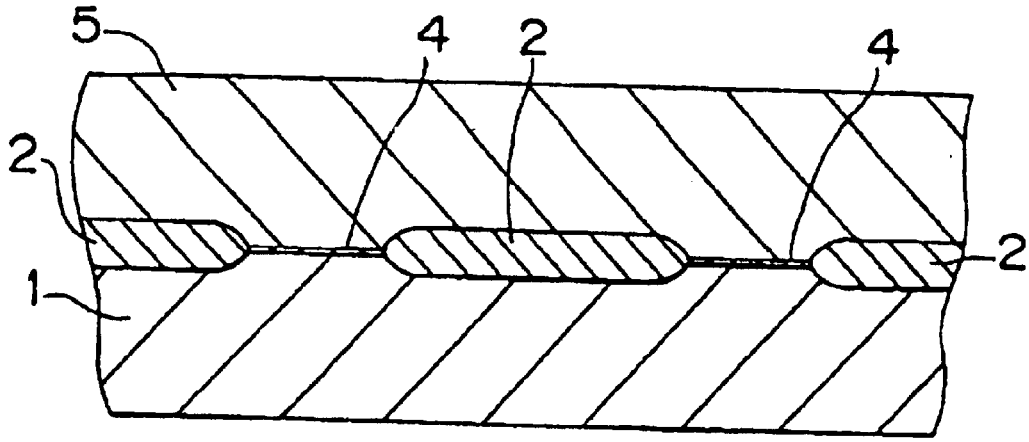

Thereafter, as shown in FIG. 8B, the surface of the polysilicon film 5 is planarized by chemical mechanical polishing (CMP).

Figure 8C:
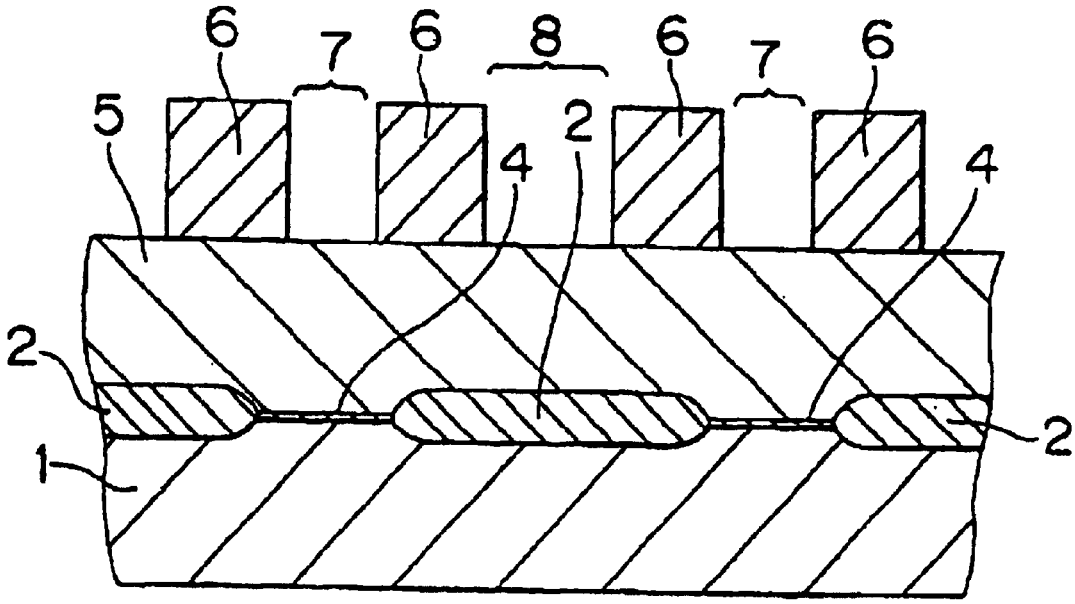

As shown in FIG. 8C, the photoresist 6 is formed on the polysilicon film 5. In the formation of this photoresist 6, a photoresist opening 7 is formed by forming an opening about 0.6 μm wide in a region for isolating floating gate electrodes 9 to be formed later. Also, photoresist openings 8 are formed by forming openings about 0.6 μm wide in portions above regions corresponding to the centers of the floating gate electrodes 9.

The polysilicon film 5 is dry-etched by using the photoresist 6 as a mask, and the etching is stopped when the field oxide film 2 is exposed in the photoresist opening 7. The surface of the polysilicon film 5 is previously planarized by chemical mechanical polishing described above. Therefore, when etching is stopped at the time the field oxide film 2 is exposed, the tunnel oxide film 4 is not exposed and recesses 20 are formed in the photoresist openings 8 due to the step between the surfaces of the field oxide film 2 and the tunnel oxide film 4.

Figure 8D:
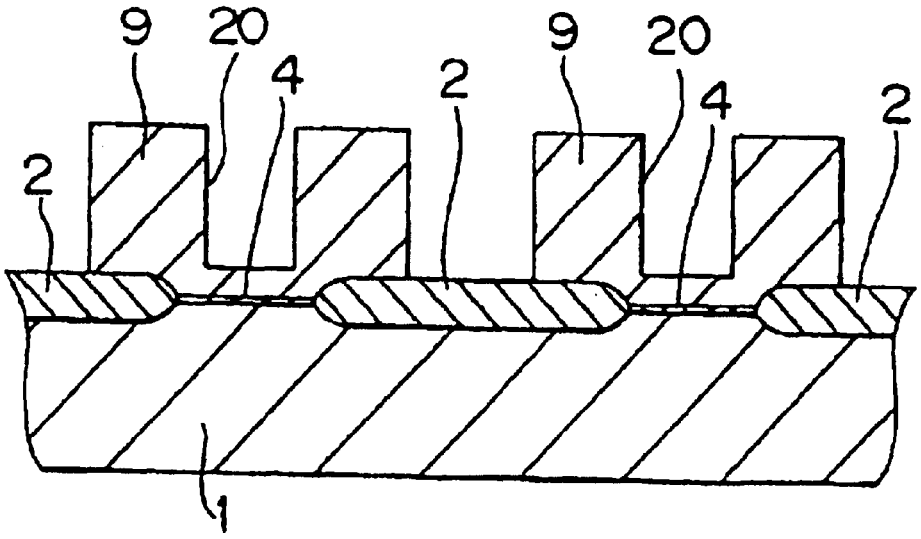

Accordingly, the recesses 20 can be formed with high controllability at the same time the floating gate electrodes 9 are isolated. This state is shown in FIGS. 8D and 9.

Thereafter, as in the first embodiment, a dielectric film 10 made from an ONO film (not shown) is formed, a polysilicon film 11 is formed by CVD, and these films are patterned to form composite gate electrodes 12.

Following the same procedure as in the first embodiment, arsenic is ion-implanted into the p-type semiconductor substrate, a BPSG film 15 (not shown) is formed, and reflow is performed. Finally, contact holes 16, 17, and 18 are formed, and an aluminum alloy film 19 is formed and patterned to complete a memory cell of an EEPROM.

In the second embodiment as described above, the surface of the polysilicon film 5 is planarized before the photoresist 6 is formed. Therefore, even when etching is performed until the field oxide film 2 is exposed in the photoresist opening 7, the recesses 20 can be reliably formed in the photoresist openings 8 without exposing the underlying tunnel oxide film 4.

By sufficiently increasing the height of the step between the surface of the tunnel oxide film 4 and the surface of the field oxide film 2, the recesses 20 can be formed by leaving the polysilicon film 5 behind on the bottom surfaces with higher controllability.

Also, in the second embodiment, the recesses 20 can also be formed by self-alignment when the floating gate electrodes 9 are isolated.

Furthermore, the photoresist 6 is formed on the planarized polysilicon film 5 and patterned by lithography. Therefore, the widths of the photoresist openings 7 and 8 can be set with high controllability during lithography.

In the above first and second embodiments, a nonvolatile memory such as an EEPROM or an EPROM using the floating gate electrodes 9 made from polysilicon as a charge storage film is described. However, a stacked film of a silicon oxide film, a silicon nitride film, and a silicon oxide film may be used as a charge storage film, and the present invention may be applied to an MONOS type nonvolatile memory including this charge storage film, a control gate, a source, and a drain. The present invention may also be applied to an MNOS type nonvolatile memory including a charge storage film made from a stacked film of a silicon oxide film and a silicon nitride film, a control gate, a source, and a drain.

When a charge storage film is made from an insulating film as described above, the dielectric film 10 need not be formed. If this is the case, electric charge is stored in the interface of the silicon oxide film or the silicon nitride film.

Figure 16:
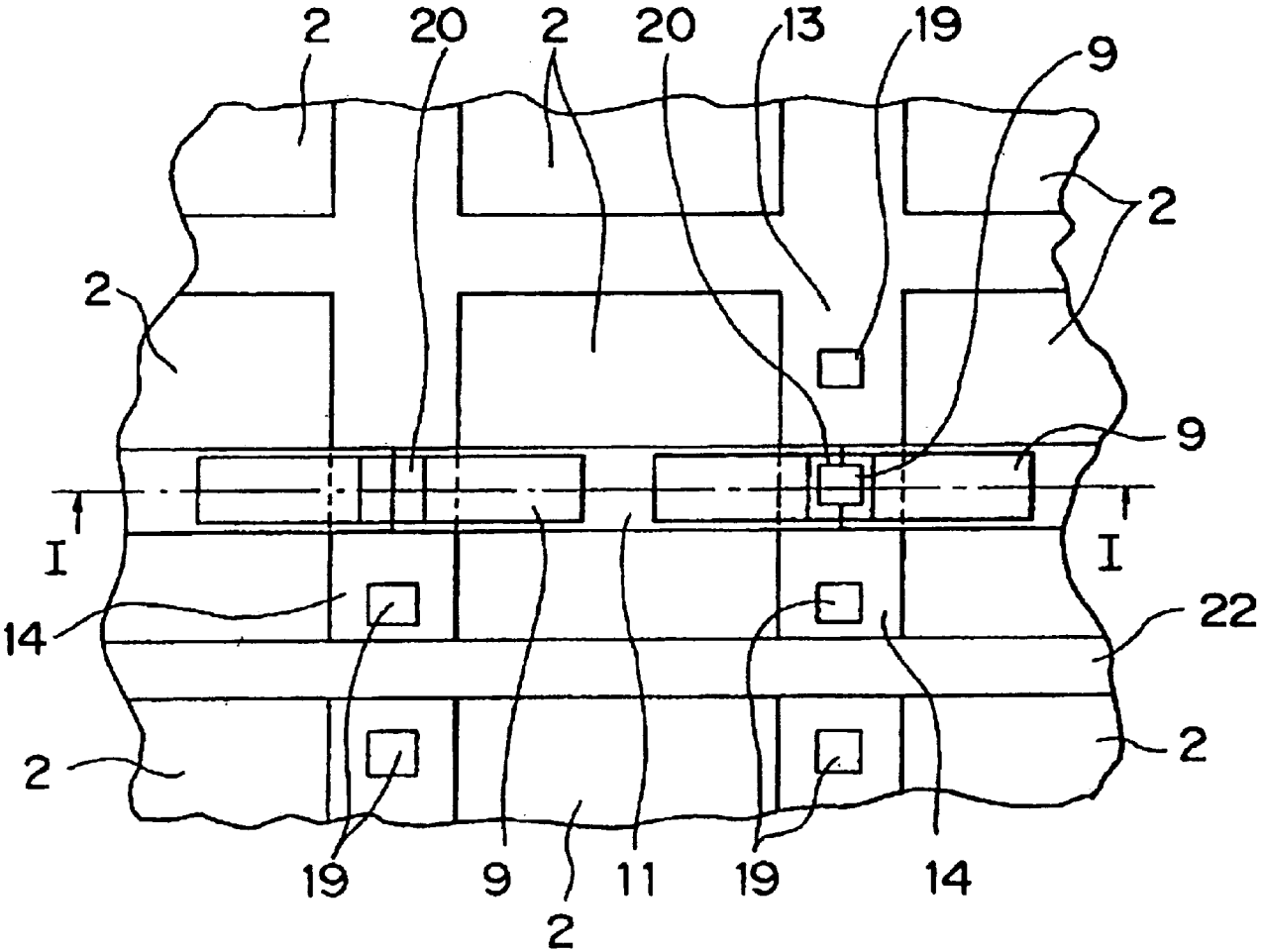
FIG. 16 is a schematic plan view showing the EEPROM according to the first embodiment.

FIG. 16 is a schematic plan view showing an embodiment in which the source region 13 is formed by a diffusion layer commonly to the unit memory cells, and the gate electrode 22 of the access transister is formed commonly to the unit memory cells, over the first and second embodiments above described.

Furthermore, if storage information is binary data, the EEPROM can also be constituted as a so-called multi-valued memory by setting a predetermined value of two bits or more as a storage state. That is, if the storage state is n bits (2n values, n is an integer of 2 or more), it is only necessary to set 2n different threshold voltages. For example, if the storage state is two bits (four values), four different reference voltages (threshold voltages) are used in a one-to-one correspondence with storage states "00", "01", "10", and "11". In a read, one storage state of each memory cell of the EEPROM is specified from the four threshold voltages by a predetermined determining operation. If the storage state is three bits (eight values), eight different reference voltages (threshold voltages) are used in a one-to-one correspondence with storage states "000", "001", "010", "011", "100", "101", "110", and "111". In a read, one storage state of each memory cell of the EEPROM is specified from the eight threshold voltages by a predetermined determining operation. In addition to the various effects described earlier, this multi-valued EEPROM greatly increases the storage density of each memory cell. Therefore, the EEPROM can well meet demands for a higher integration degree and a finer structure. If storage information is not binary data but information constituted by 0, 1, and 2, it is also possible to use "0", "1", and "2", or "00", "01", "02", "10", "11", "12", "20", "21", and "22" as storage states. The storage state is expressed by three values in the former case and nine values in the latter case. This multi-valued structure is also applicable to a DRAM (to be described later) and other various semiconductor memories as well as to the EEPROM.

A method of writing storage information when the EEPROM described above is a multi-valued memory capable of storing 2-bit information in each memory cell will be described below. First, to write storage information "11", the drain region 14 of a memory cell is connected to the ground potential, the source region 13 is opened, and a voltage of about 22 V is applied to the polysilicon film 11. Consequently, electrons are injected from the drain region 14 into the floating gate electrode 9 through the tunnel oxide film 4, and the threshold voltage ($V_T$) goes positive. Accordingly, the threshold voltage of the memory cell rises to about 4 V. This storage state is "11".

To write data "10", the drain region 14 of the memory cell is connected to the ground potential, the source region 13 is opened, and a voltage of about 20 V is applied to the polysilicon film 11. Consequently, electrons are injected from the drain region 14 into the floating gate electrode 9 through the tunnel oxide film 4, and the threshold voltage of the memory cell changes to about 3 V. This storage state is "10".

To write data "01", the drain region 14 of the memory cell is connected to the ground potential, the source region 13 is opened, and a voltage of about 18 V is applied to the polysilicon film 11. Consequently, electrons are injected from the drain region 14 into the floating gate .electrode 9.through the tunnel oxide film 4, and the threshold voltage of the memory cell changes to about 2 V. This storage state is "01".

To write data "00", the drain region 14 of the memory cell is connected to the ground potential, the source region 13 is opened, and a voltage of about 10 V is applied to the polysilicon film 11. Consequently, the electrons injected into the floating gate electrode 9 are cleared from the drain region 14, and the threshold voltage of the memory cell changes to about 1 V. This storage state is "00".

Figure 17:
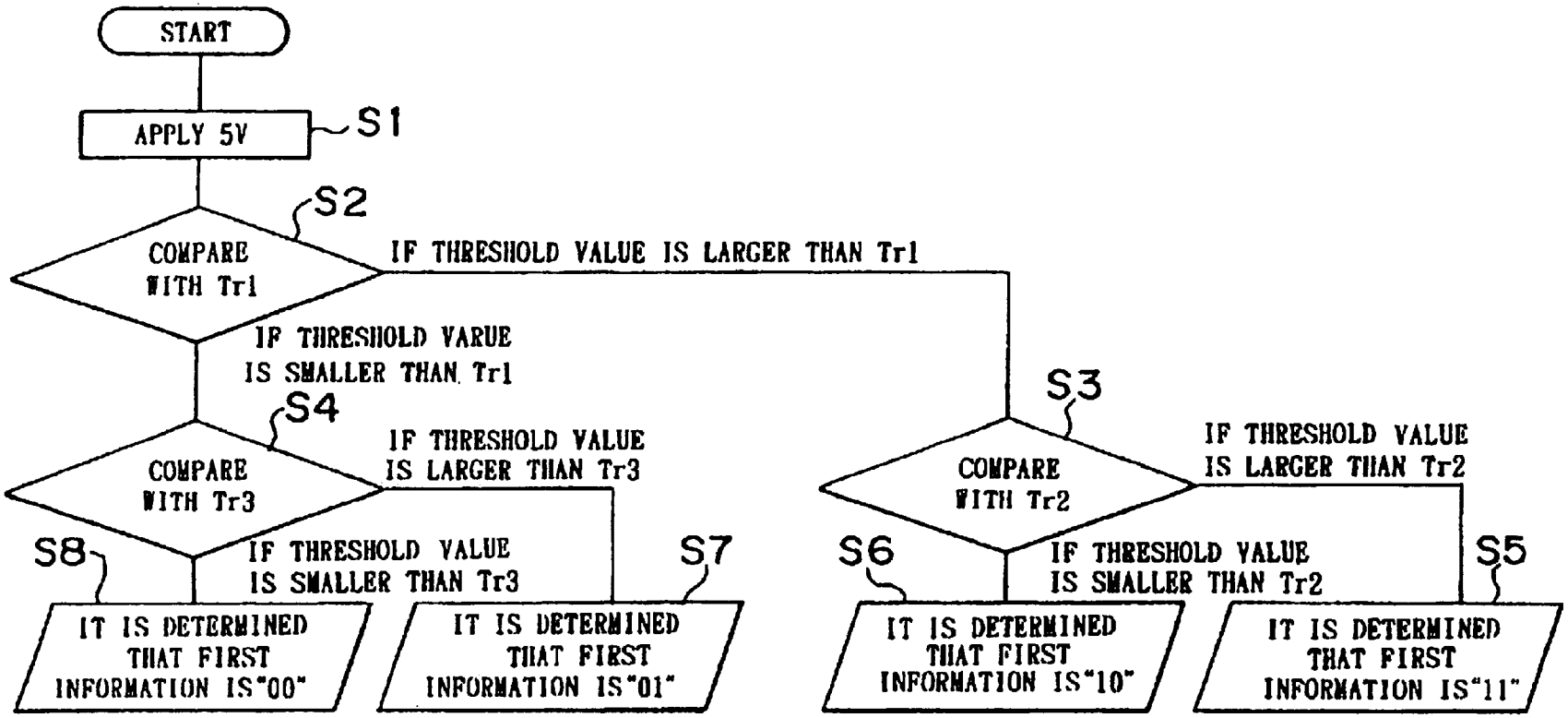
FIG. 17 is a flow chart showing a read method of the EEPROM according to the first embodiment.

Individual steps of a read method when the EEPROM described above is a multi-valued memory capable of storing 2-bit information in each memory cell will be described below with reference to FIG. 17. First, whether the upper bit of storage information stored in a memory cell is "0" or "1" is checked. To this end, a voltage of about 5 V is applied to the source region 13 and the drain region 14 and the polysilicon film 11 (step S1). The drain current is detected by a sense amplifier, and the threshold voltage $V_T$ is compared with the threshold voltage of a comparative transistor Tr1 (step S2). If the threshold voltage $V_T$ is larger than the threshold voltage of the transistor Tr1, it is determined that the upper bit is "1". If the current of the transistor Tr1 is smaller, it is determined that the upper bit is "0".

If the threshold voltage $V_T$ is larger than the threshold voltage of the transistor Tr1, a similar read is performed by using a transistor Tr2, and the current flowing through the memory cell is compared with the current flowing through the transistor Tr2 (step S3). If the threshold voltage $V_T$ is smaller than the threshold voltage of the transistor Tr1, a similar read is performed by using a transistor Tr3 (step S4).

If the threshold voltage $V_T$ is larger than the threshold voltage of the transistor Tr2 in the read performed in step S3, it is determined that the storage information stored in the memory cell is "11" (step S5), and the information is read out from the memory cell on the other hand, if the threshold voltage $V_T$ is smaller than the threshold voltage of the transistor Tr2 in step S3, it is determined that the storage information stored in the memory cell is "10" (step S6), and the information is read out from the memory cell.

If the threshold voltage of the memory cell is larger than the threshold voltage of the transistor Tr3 in step S4, it is determined that the storage information stored in the memory cell is "01" (step S7), and the information is read out from the memory cell. If the threshold voltage $V_T$ is smaller than the threshold voltage of the transistor Tr3 in step S4, it is determined that the storage information stored in the memory cell is "00" (step S8), and the information is read out from the memory cell.

Third Embodiment

The arrangement of a stacked capacitor cell structure DRAM according to the third embodiment of the present invention and a method of fabricating the same will be described below. FIGS. 10A to 10K are side sectional views showing the steps in fabricating two adjacent DRAM memory cells in the third embodiment. FIG. 11 is a schematic plan view showing these DRAM memory cell regions. A section I—I in FIG. 11 corresponds to FIGS. 10A to 10K.

Figure 10A:
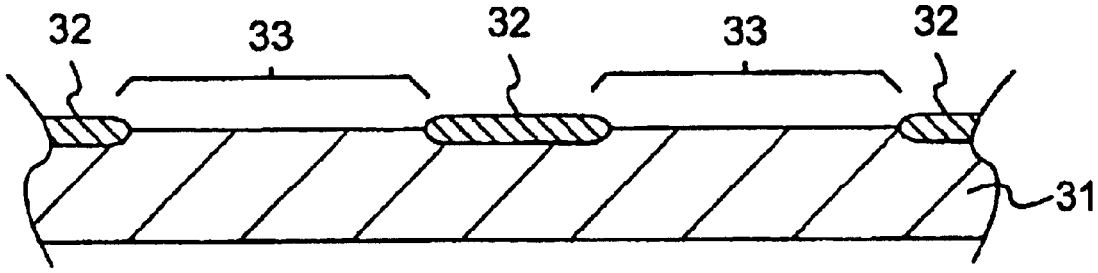
FIGS. 10A to 10K are schematic sectional views showing a method of fabricating a stacked capacitor cell structure DRAM according to the third embodiment in order of steps.
Figure 11:
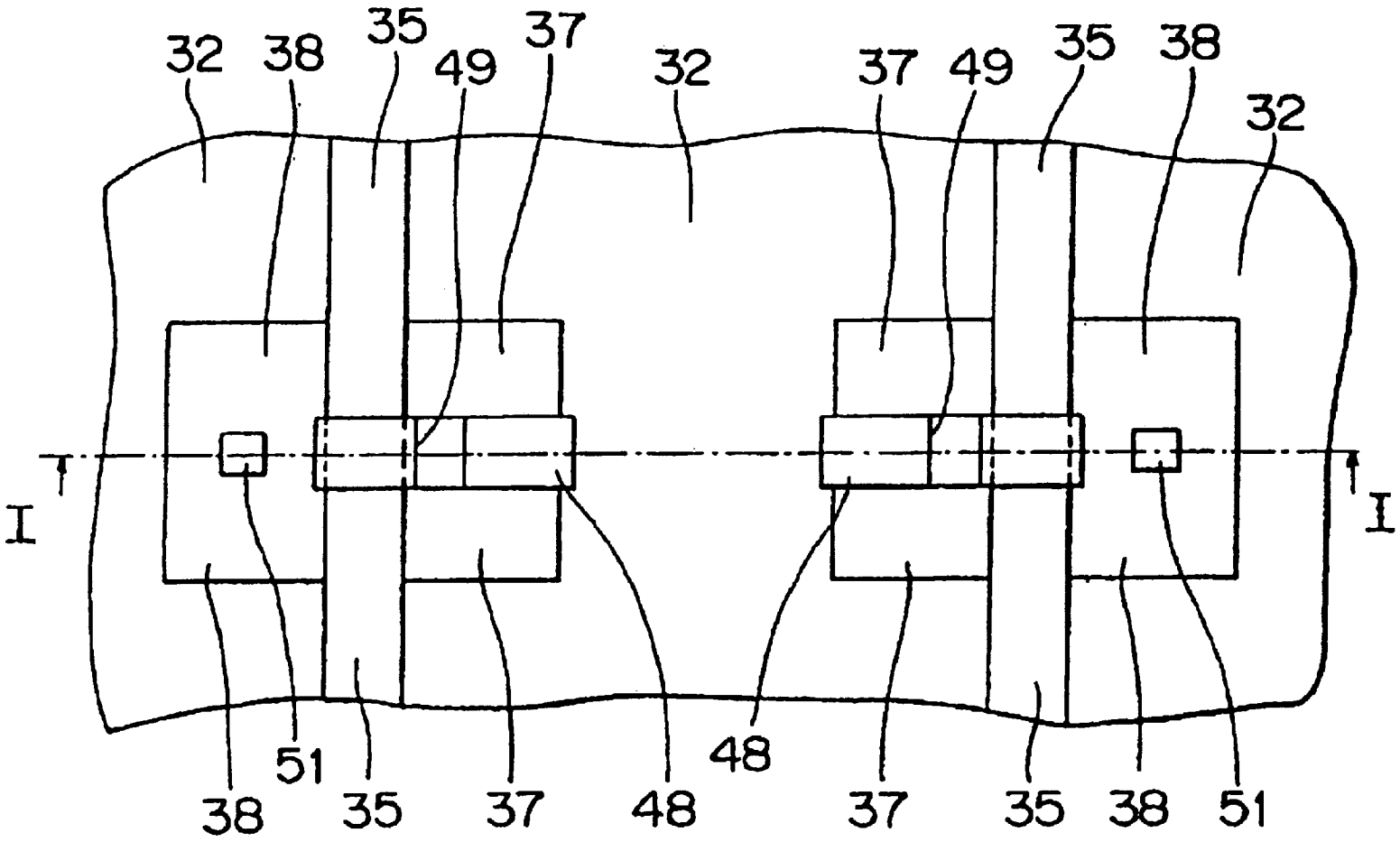
FIG. 11 is a schematic plan view showing the stacked capacitor cell structure DRAM according to the third embodiment.

First, as shown in FIG. 10A, the surface of a p-type silicon semiconductor substrate 31 is selectively oxidized by a so-called LOCOS process to form a field oxide film 32. Consequently, element isolation is achieved on the p-type silicon semiconductor substrate 31 to define two element formation regions 32.

Subsequently, the surface of the element formation regions 32 is thermally oxidized to form a gate oxide film 34 having a thickness of about 130 Å. Thereafter, a polysilicon film 35 is formed on the entire surface by CVD.

Figure 10B:
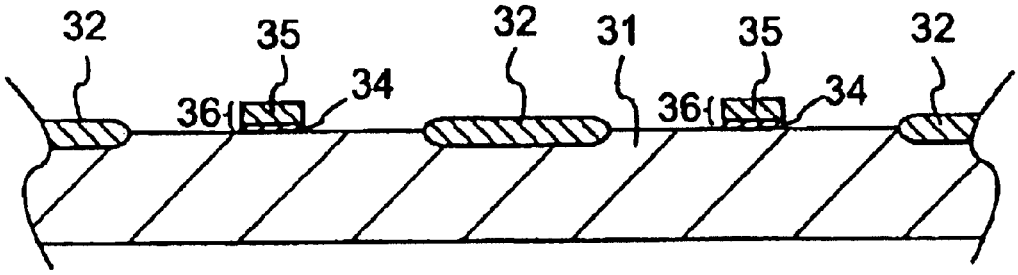

The gate oxide film 34 and the polysilicon film 35 are then patterned by photolithography and subsequent dry etching, thereby forming gate electrodes 36. This state is shown in FIG. 10B.

Figure 10C:
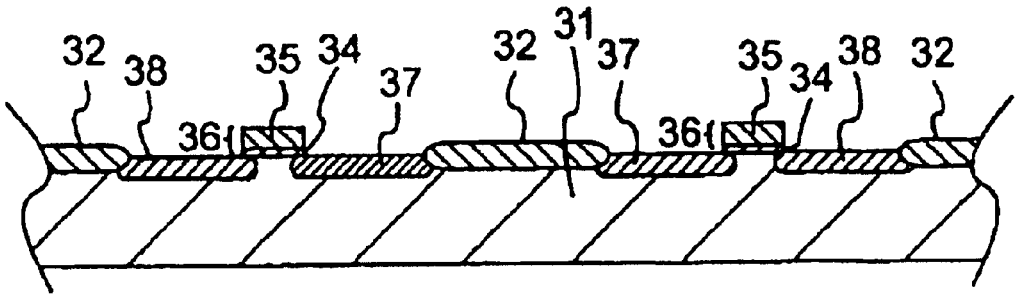

By using the gate electrodes 36 as masks, arsenic is ion-implanted to form source regions 37 and drain regions 38 as n-type impurity diffusion layers. Annealing is then performed to activate the arsenic ions. Appropriate ion-implantation conditions are an acceleration energy of about 70 kev and a dose of about $5\times10^{15}/cm^2$. Appropriate annealing conditions are a temperature of 900° C. and an annealing time of about 30 min. Consequently, n-type MOS transistors are formed on the p-type silicon substrate 31 as shown in FIG. 10C.

Figure 10D:
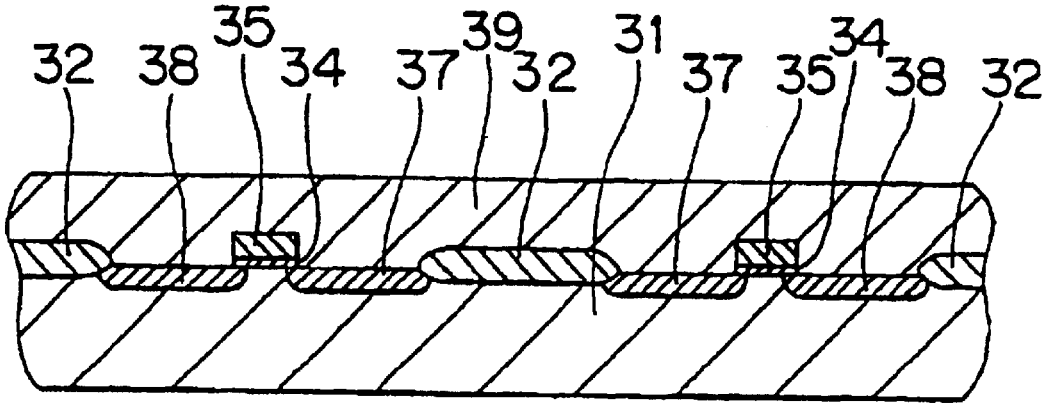

Next, as shown in FIG. 10D, a BPSG film 39 as an insulating interlayer is formed on the entire surface of the p-type silicon semiconductor substrate 31 by CVD, and the surface is planarized by reflow.

Figure 10E:
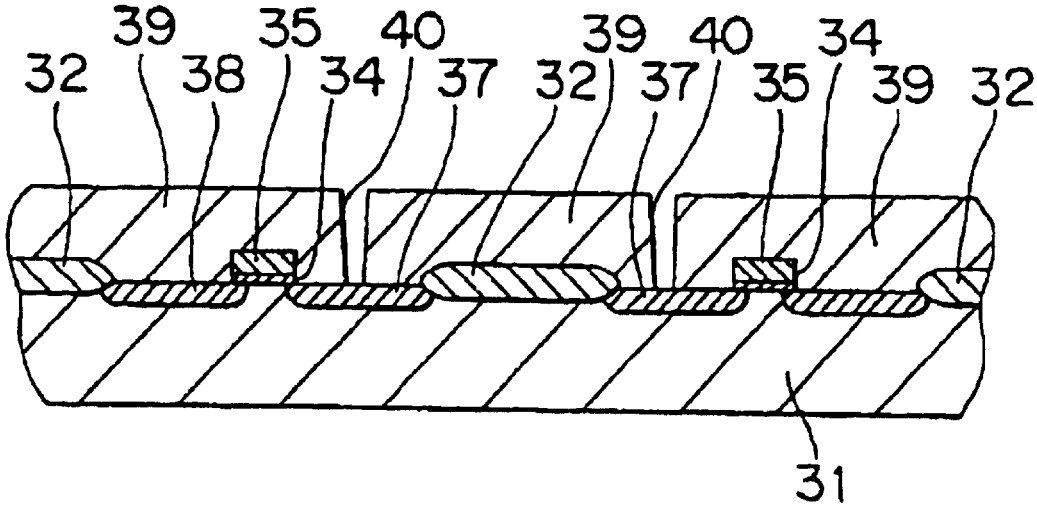
Figure 10F:
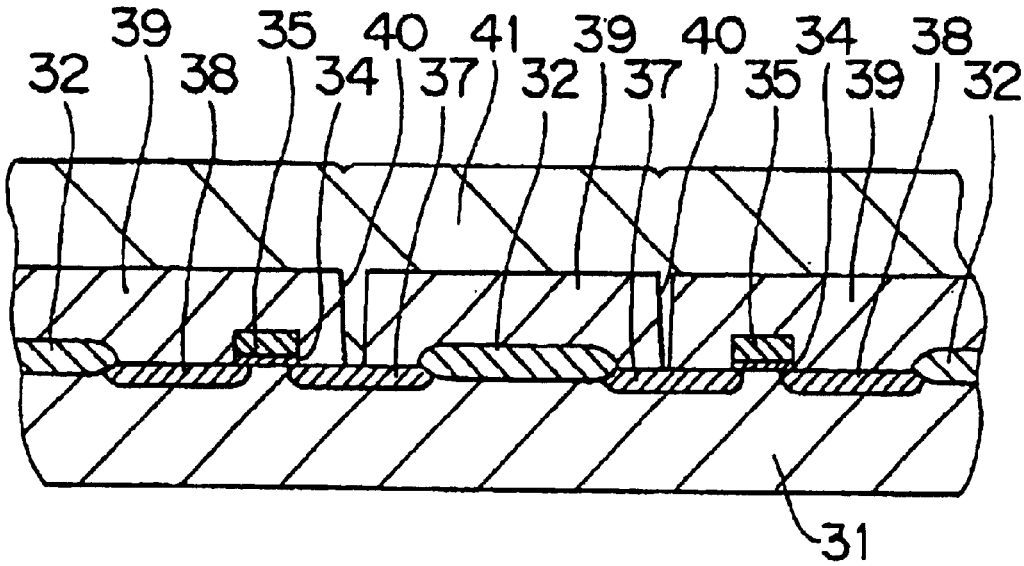

As shown in FIG. 10E, holes 40 for exposing portions of the source regions 27 are formed in the BPSG film 39. Thereafter, a polysilicon film 41 is formed in the holes 40 and on the BPSG film 39 by adding a dopant gas by low-pressure CVD. Alternatively, an undoped polysilicon film 41 may be formed on the BPSG film 39 and given conductivity by ion-implanting an impurity such as arsenic. This state is shown in FIG. 10F.

Figure 10G:
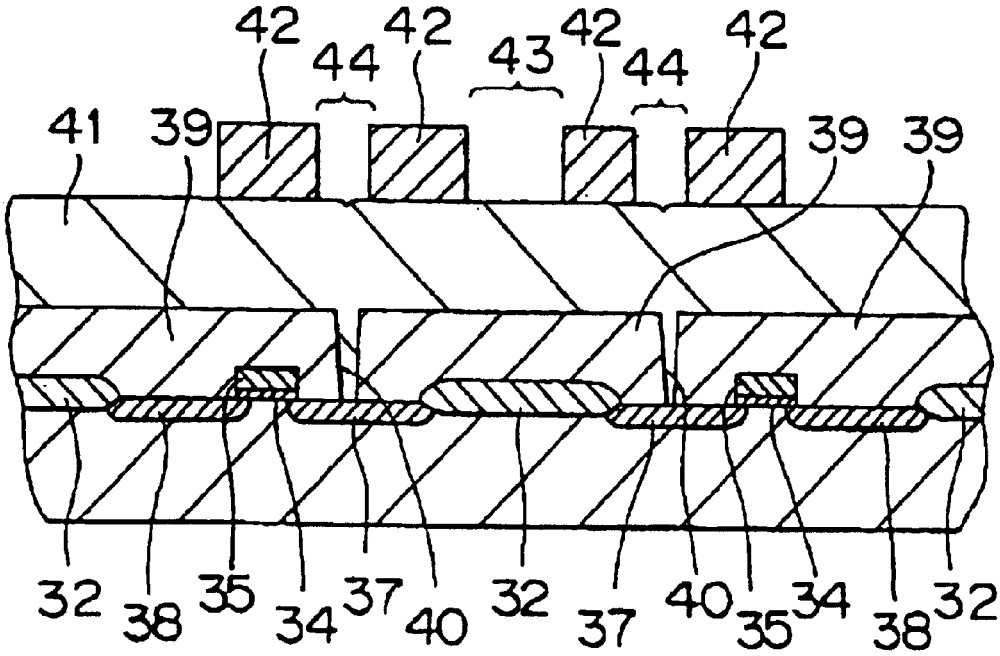

Subsequently, a photoresist 42 is formed on the polysilicon film 41 by photolithography. In this photolithography, as shown in FIG. 10G, a photoresist opening 43 is formed by forming an opening about 0.6 μm wide in a region for isolating lower electrodes 48 of adjacent stacked capacitor cells to be formed later. Also, photoresist openings 44 are formed by forming openings about 0.25 μm wide in regions near the centers of the lower electrodes 48 to be formed.

By using the photoresist 42 as a mask, the polysilicon film 41 is selectively removed by dry etching. Since the width of the photoresist openings 44 is smaller than the half width of the photoresist opening 43, the supply of the etchant is reduced by a microloading effect when the polysilicon film 41 exposed in the photoresist openings 44 is etched. As a consequence, the etching rate is decreased in these portions.

That is, the progress in etching polysilicon film 41 exposed in the photoresist opening 43 is faster than the progress in etching the polysilicon film 41 exposed in the photoresist openings 44. Accordingly, the polysilicon film 41 exposed in the photoresist opening 43 is removed first, and the underlying BPSG film 39 is exposed.

Figure 10H:
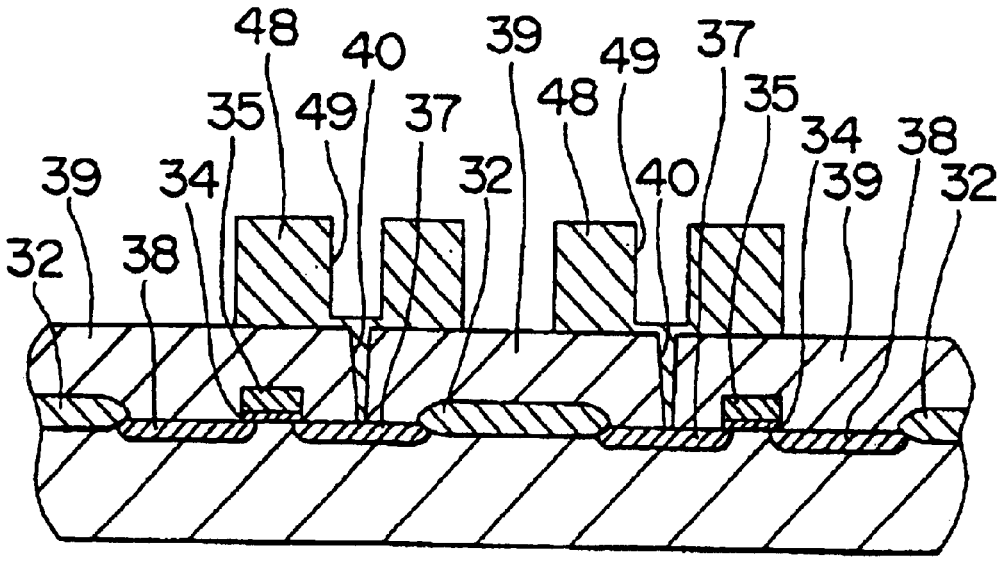

This dry etching is stopped when the BPSG film 39 is exposed in the photoresist opening 43. Consequently, the polysilicon film 41 is separated in the position of the photoresist opening 43, forming the lower electrodes 48 of the stacked capacitor cells. In the positions of the photoresist openings 44, the polysilicon film 41 remains on the bottom surfaces to form recesses 49 in the lower electrodes 48. This state is shown in FIG. 10H.

Next, a silicon nitride film about 30 Å thick is deposited on the entire surface by LPCVD and oxidized in an oxygen atmosphere at about 850° C., thereby forming a dielectric film 45 made from an ONO film.

Figure 10I:
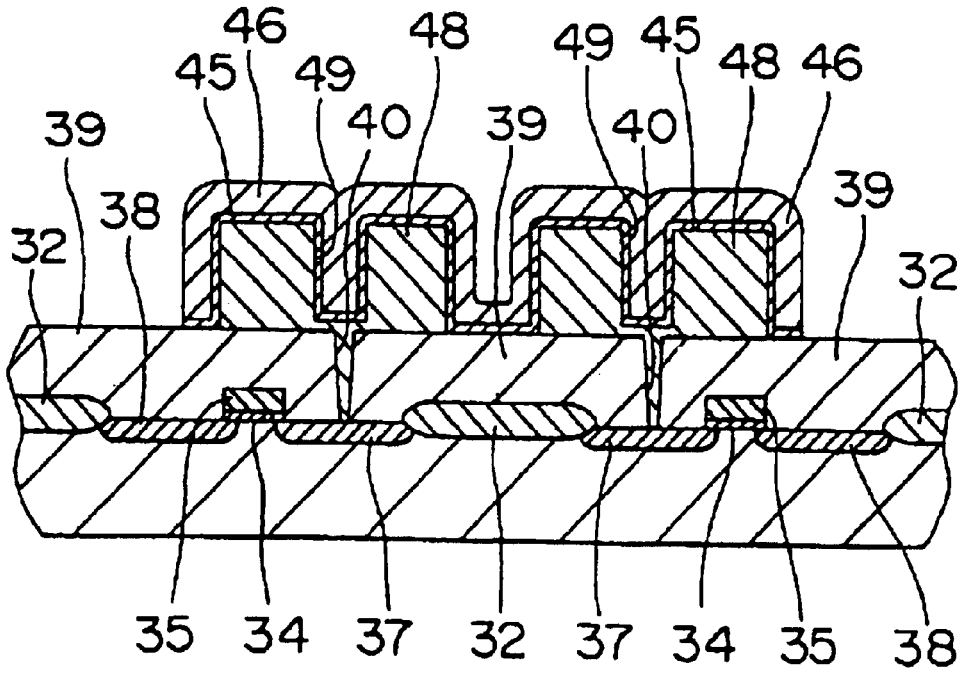

A polysilicon film 46 having a thickness of about 1,500 Å and serving as an upper electrode of the stacked capacitor cells is formed on the dielectric film 45 by CVD and patterned together with the dielectric film 45, thereby completing a stacked capacitor cell structure including the lower electrodes 48, the dielectric film 45, and the polysilicon film 46 as an upper electrode as shown in FIG. 10I. In this structure, the lower electrodes 48 achieve the function of charge storage films which capacitively couple with the polysilicon film 46 through the dielectric film 45.

Figure 10J:
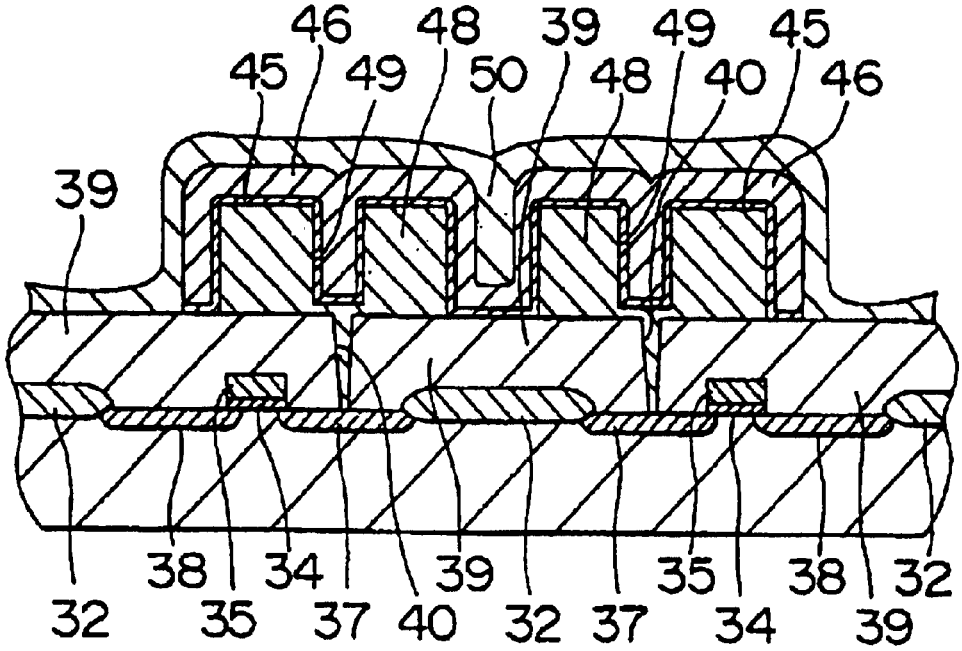
Figure 10K:
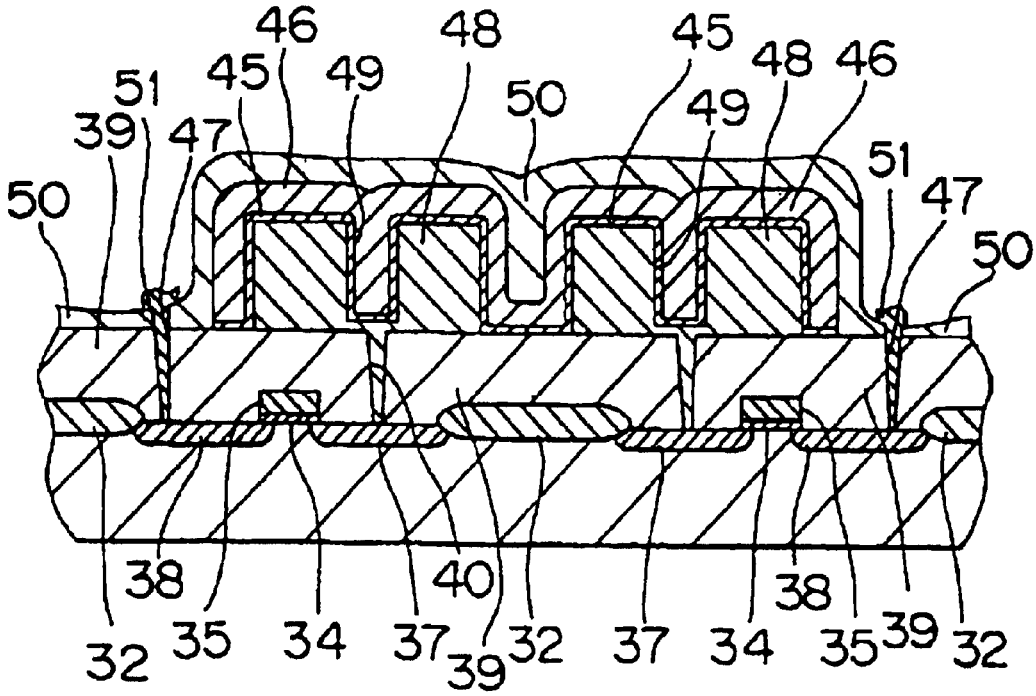

Subsequently, as shown in FIG. 10J, a BPSG film 50 is formed on the entire surface and subjected to reflow, and contact holes 47 are formed to expose portions of the drain regions 38. Thereafter, an aluminum alloy film 51 as a bit line is filled in the contact holes 47 and deposited on the BPSG film by sputtering. Finally, the aluminum alloy film 51 is patterned to complete a stacked capacitor cell structure DRAM as shown in FIGS. 10K and 11.

In the third embodiment as described above, in separating the adjacent lower electrodes 48 in the stacked capacitor cell structure DRAM, the width of the photoresist openings 44 is made smaller than the half width of the photoresist opening 43. Consequently, even when the polysilicon film 41 exposed in the photoresist opening 43 is etched away until the underlying BPSG film 39 is exposed, the polysilicon film 41 is left behind on the bottom surfaces of the photoresist openings 44 by the microloading effect, forming the recesses 49 in these portions.

Since etching is stopped when the BPSG film 39 is exposed, the bottom surfaces of the recesses 49 are reliably positioned above the surface of the BPSG film 39 by the microloading effect. This prevents the polysilicon film 41 from being separated by the recesses 20. Accordingly, the lower electrodes 48 having the recesses 49 can be stably formed.

Also, the recesses 49 are formed by self-alignment at the same time the lower electrodes 48 are isolated. Therefore, the recesses 49 can be formed without increasing the number of fabrication steps.

In each stacked capacitor cell including the lower electrode 48 having the recess 49, the dielectric film 45 made from the ONO film, and the polysilicon film 46 as the upper electrode, the capacitance of the dielectric film 45 is increased by the recess 49. As a consequence, the write and erase characteristics of the memory cell can be improved.

Modifications

A modification of the third embodiment will be described below. FIGS. 12A to 12E are side sectional views showing the steps in fabricating two adjacent DRAM memory cell capacitors according to this modification. FIG. 13 is a schematic plan view showing the memory cell capacitors. A section I—I in FIG. 13 corresponds to FIGS. 12A to 12E. The same reference numerals as in the DRAM of the third embodiment denote the same parts, and a detailed description thereof will be omitted.

Figure 12A:
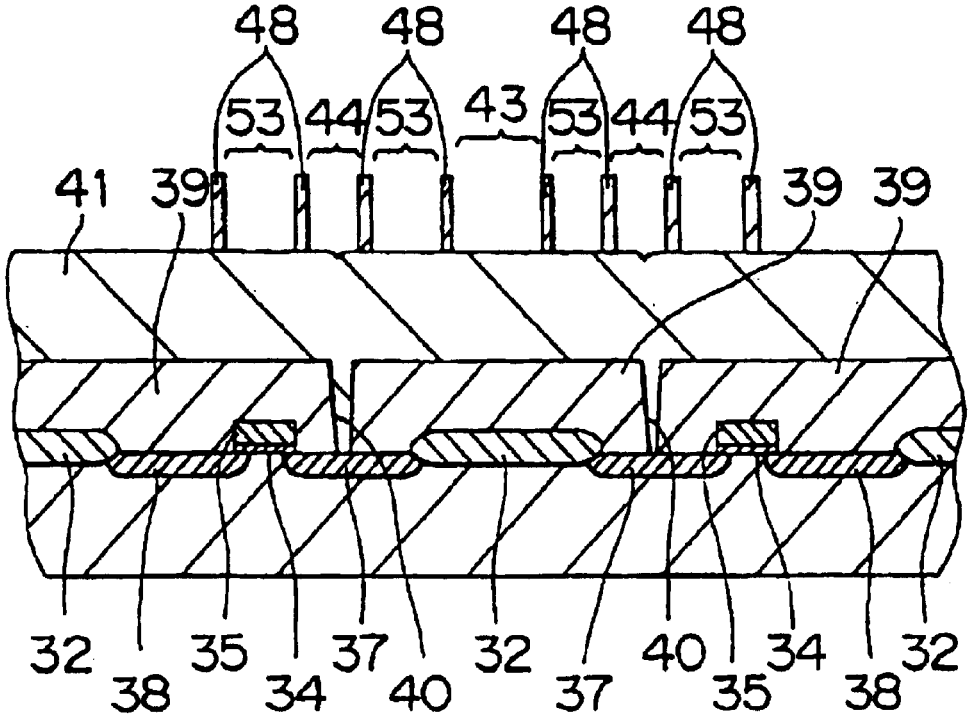
FIGS. 12A to 12E are schematic sectional views showing a method of fabricating a stacked capacitor cell structure DRAM according to a modification of the third embodiment in order of steps.
Figure 13:
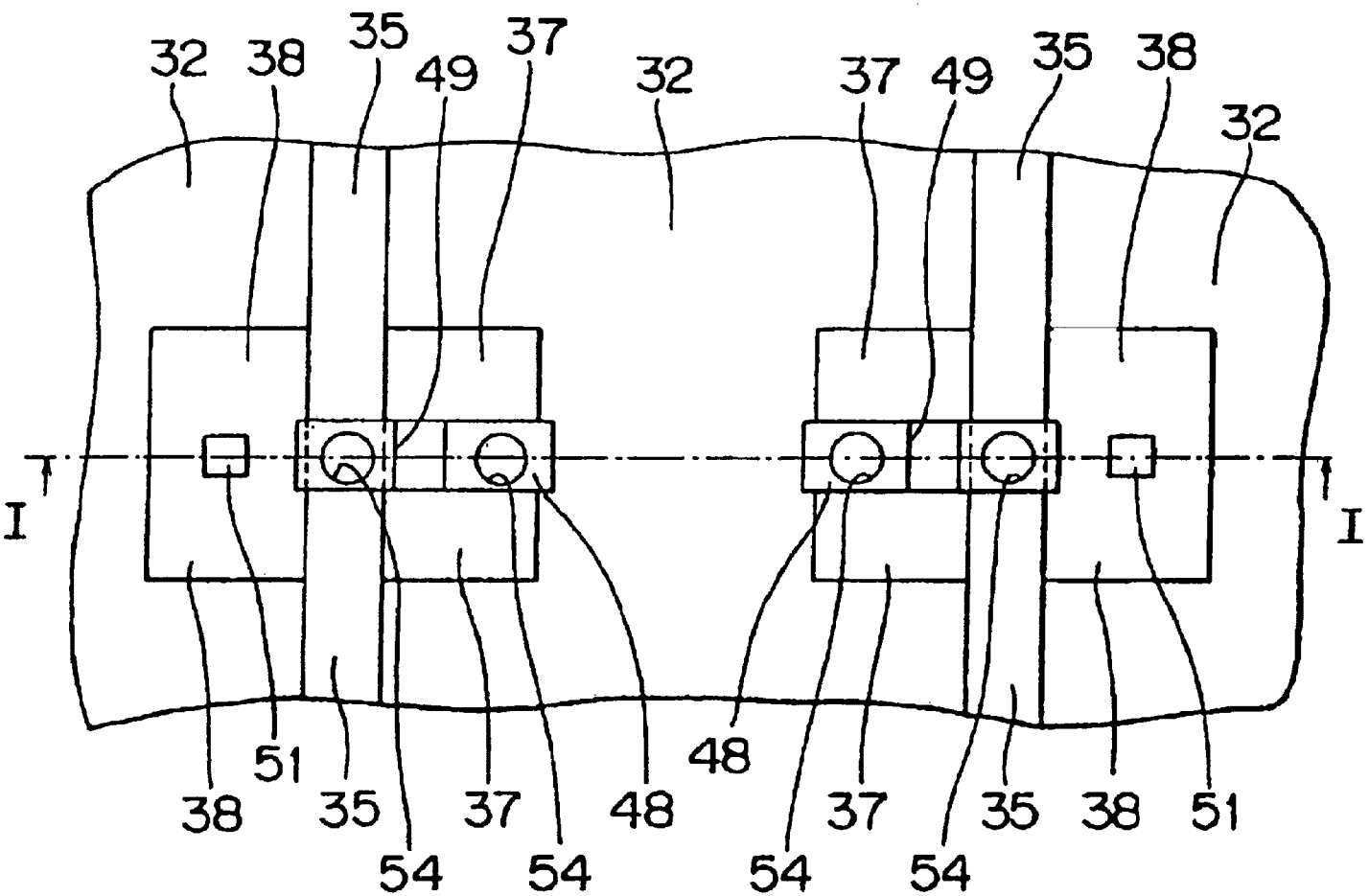
FIG. 13 is a schematic plan view showing the stacked capacitor cell structure DRAM according to the modification of the third embodiment shown in FIGS. 12A to 12E.

FIG. 12A corresponds to the step shown in FIG. 10G of the third embodiment. In this modification, the steps up to the state shown in FIG. 12A are the same as in the third embodiment. As shown in FIG. 12A, the number of openings in the photoresist 42 formed on the polysilicon film 41 is larger than in the third embodiment.

That is, following the same procedure as in the third embodiment, the photoresist opening 43 is formed by forming an opening about 0.6 μm wide in a region for isolating the lower electrodes 48 of adjacent stacked capacitor cells to be described later. Also, the photoresist openings 44 are formed by forming openings about 0.25 μm wide in regions near the centers of the lower electrodes 48 to be formed. In this modification, substantially cylindrical photoresist openings 53 are formed between the photoresist openings 43 and 44.

By using the photoresist 42 as a mask, the polysilicon film 41 is selectively removed by dry etching. Since the width of the photoresist openings 44 is made smaller than the half width of the photoresist openings 43 and 53, the supply of the etchant is reduced by a microloading effect when the polysilicon film 41 exposed in the photoresist openings 44 is etched. As a consequence, the etching rate is decreased in these portions.

That is, the progress in etching the polysilicon film 41 exposed in the photoresist openings 43 and 53 is faster than the progress in etching the polysilicon film 41 exposed in the photoresist openings 44. Accordingly, the polysilicon film 41 exposed in the photoresist openings 43 and 53 is removed first, and the underlying BPSG film 39 is exposed.

Figure 12B:
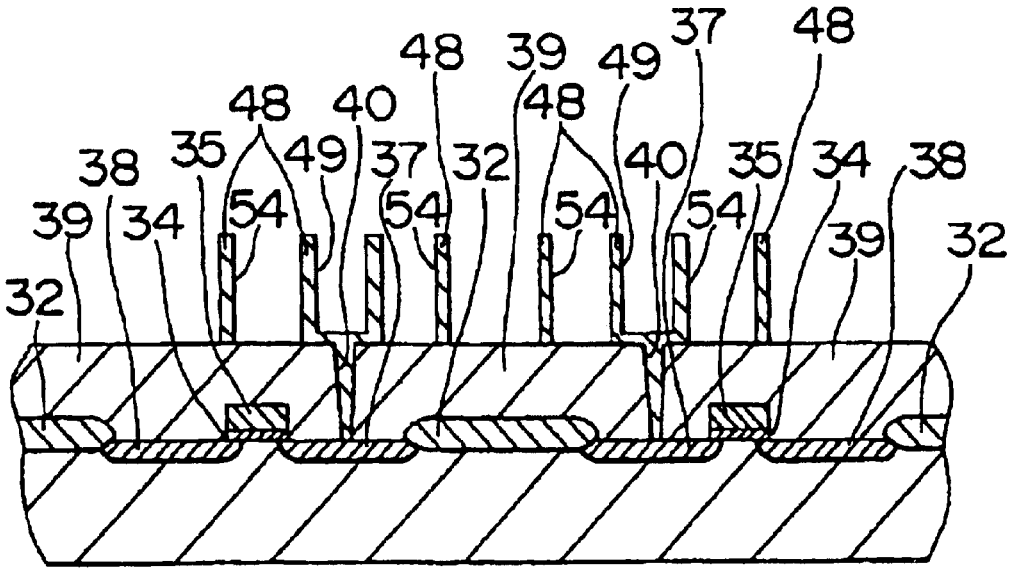

This dry etching is stopped when the BPSG film 39 is exposed in the photoresist openings 43 and 53. Consequently, the polysilicon film 41 is separated in the position of the photoresist opening 43, forming the lower electrodes 48 of the stacked capacitor cells. In the photoresist openings 53, the underlying BPSG film is exposed to form substantially cylindrical openings 54 in the lower electrodes 48. Also, in the positions of the photoresist openings 44, the polysilicon film 41 remains on the bottom surfaces to form recesses 49 in the lower electrodes 48. This state is shown in FIG. 12B.

Subsequently, a silicon nitride film about 30 Å thick is deposited on the entire surface by LPCVD and oxidized in an oxygen atmosphere at about 850° C., thereby forming the dielectric film 45 made from an ONO film.

Figure 12C:
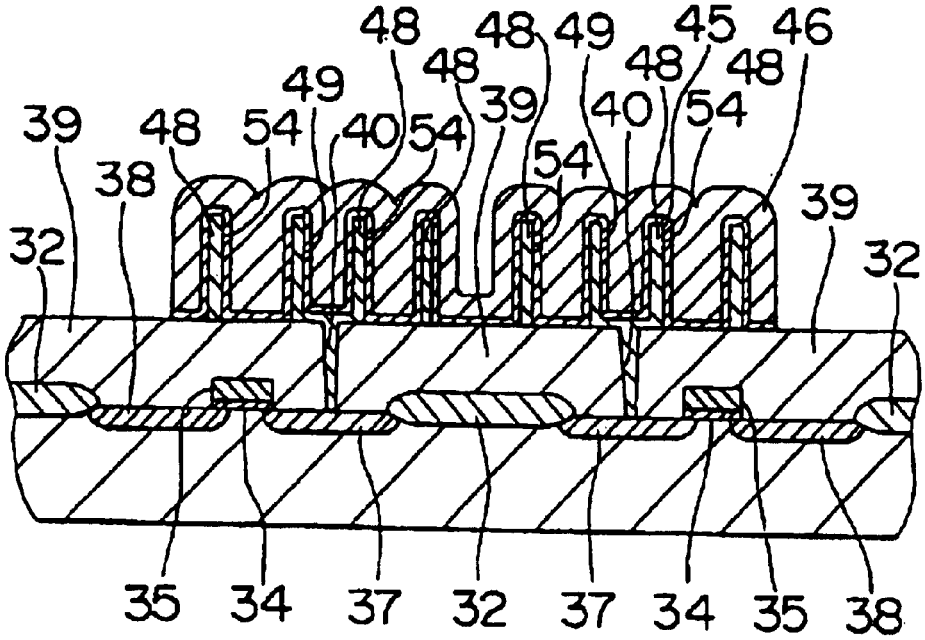

The polysilicon film 46 having a thickness of about 1,500 Å and serving as an upper electrode of the stacked capacitor cells is formed on the dielectric film 45 by CVD and patterned together with the dielectric film 45, thereby completing a stacked capacitor cell structure including the lower electrodes 48, the dielectric film 45, and the polysilicon film 46 as an upper electrode as shown in FIG. 12C.

Figure 12D:
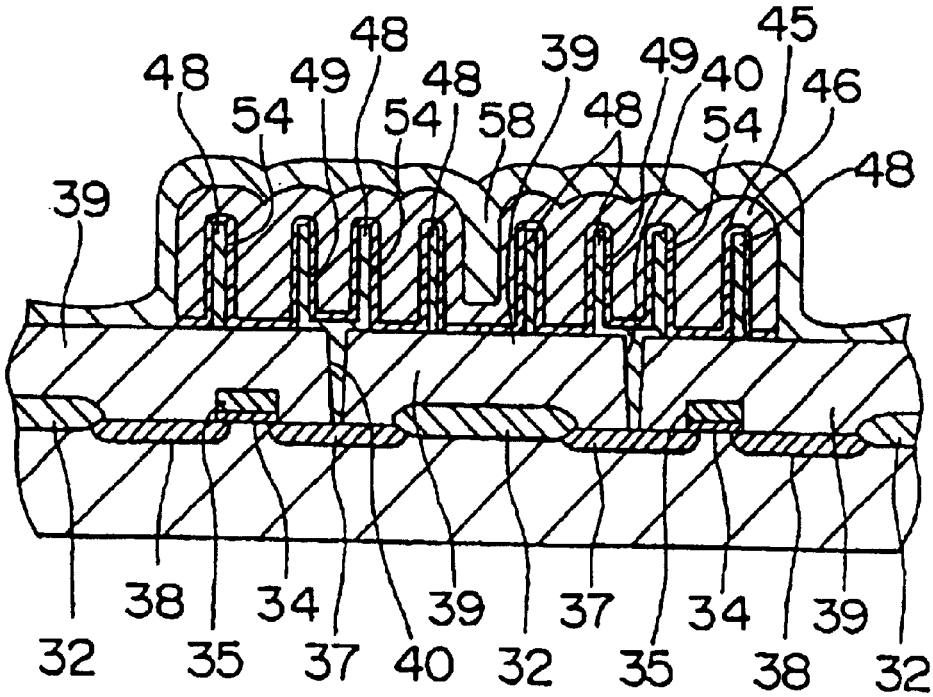
Figure 12E:
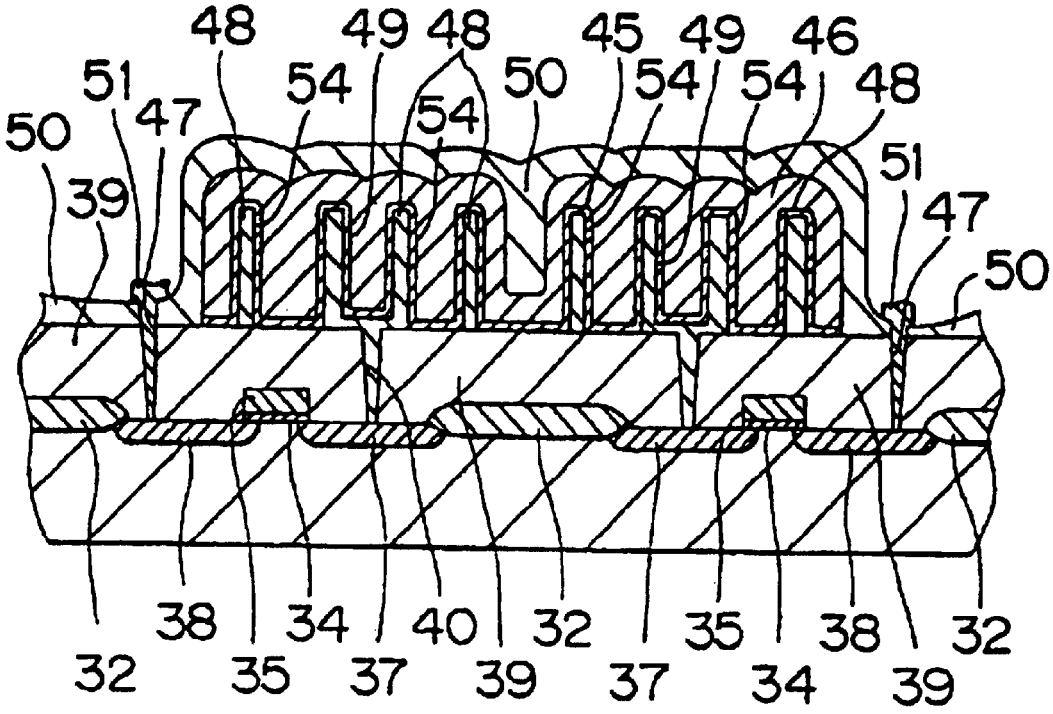

Subsequently, as shown in FIG. 12D, the BPSG film 50 is formed on the entire surface and subjected to reflow, and the contact holes 47 are formed to expose portions of the drain regions 38. Thereafter, the aluminum alloy film 51 as a bit line is filled in the contact holes 47 and deposited on the BPSG film by sputtering. Finally, the aluminum alloy film 51 is patterned to complete a stacked capacitor cell structure DRAM as shown in FIGS. 12E and 13.

In this modification, the capacitance of the dielectric film 45 made from an ONO film can be further increased by the substantially cylindrical openings 54 compared to the third embodiment. As a consequence, the capacitive coupling ratio can be increased.

Note that the etching rate controlled by the microloading effect can be increased or decreased by properly changing the diameter of the photoresist openings 53 in the above modification. For example, the diameter may be made smaller than in the above modification to set the same etching rate as the photoresist openings 44, and the polysilicon film 41 may be removed to the extent to which the underlying field oxide film 39 is not exposed.

Figure 14A:
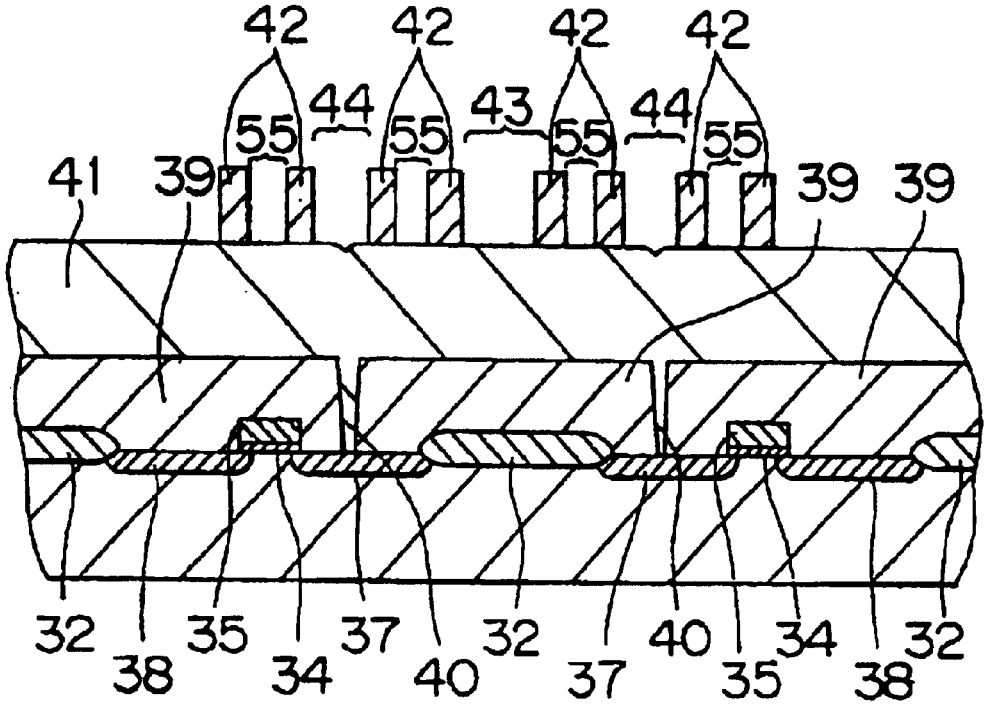
FIGS. 14A to 14E are schematic sectional views showing a method of fabricating a stacked capacitor cell structure DRAM according to another modification of the third embodiment in order of steps.

If this is the case, in the step shown in FIG. 12A, substantially cylindrical photoresist openings 55 having a smaller diameter are formed between the photoresist openings 43 and 44 as shown in FIG. 14A.

By using a photoresist 42 as a mask, the polysilicon film 41 is selectively removed by dry etching. Since the width of the photoresist openings 44 and 55 is made smaller than the half width of the photoresist opening 43, the supply of the etchant is reduced by the microloading effect when the polysilicon film 41 exposed in the photoresist openings 44 and 55 is etched. As a consequence, the etching rate is decreased in these portions.

That is, the progress in etching the polysilicon film 41 exposed in the photoresist opening 43 is faster than the progress in etching the polysilicon film 41 exposed in the photoresist openings 44 and 55. Accordingly, the polysilicon film 41 exposed in the photoresist opening 43 is removed first, and the underlying BPSG film 39 is exposed.

Figure 14B:
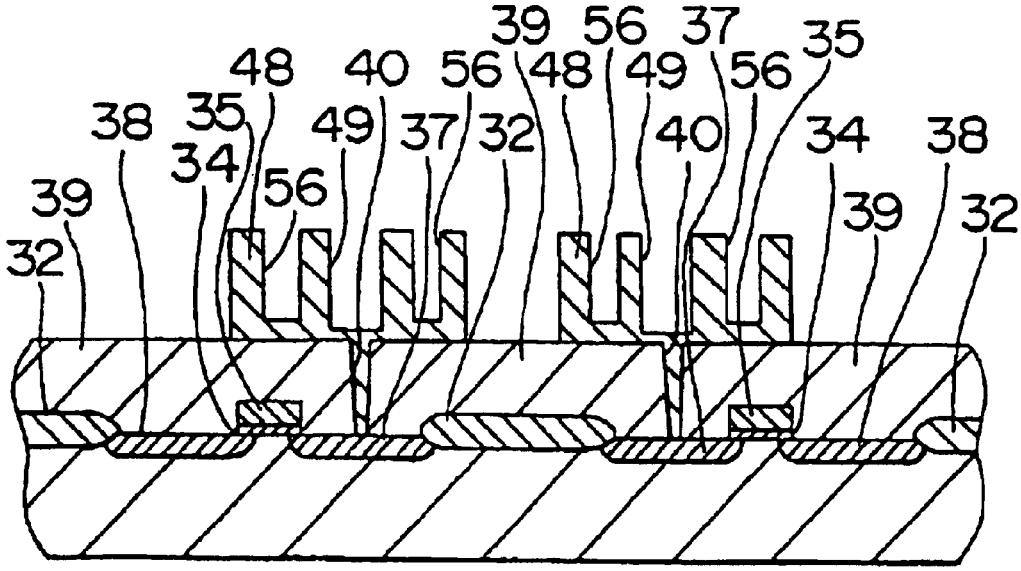

This dry etching is stopped when the BPSG film 39 is exposed in the photoresist opening 43. Consequently, the polysilicon film 41 is separated in the position of the photoresist opening 43, forming lower electrodes 48 of stacked capacitor cells. In the positions of the photoresist openings 44, the polysilicon film 41 remains on the bottom surfaces to form recesses 49 in the lower electrodes 48. Also, in the positions of the photoresist openings 55, the polysilicon film 41 remains on the bottom surfaces to form substantially cylindrical recesses 56 in the lower electrodes 48. This state is shown in FIG. 14B.

Subsequently, a silicon nitride film about 30 Å thick is deposited on the entire surface by LPCVD and oxidized in an oxygen atmosphere at about 850° C., thereby forming the dielectric film 45 made from an ONO film.

Figure 14C:
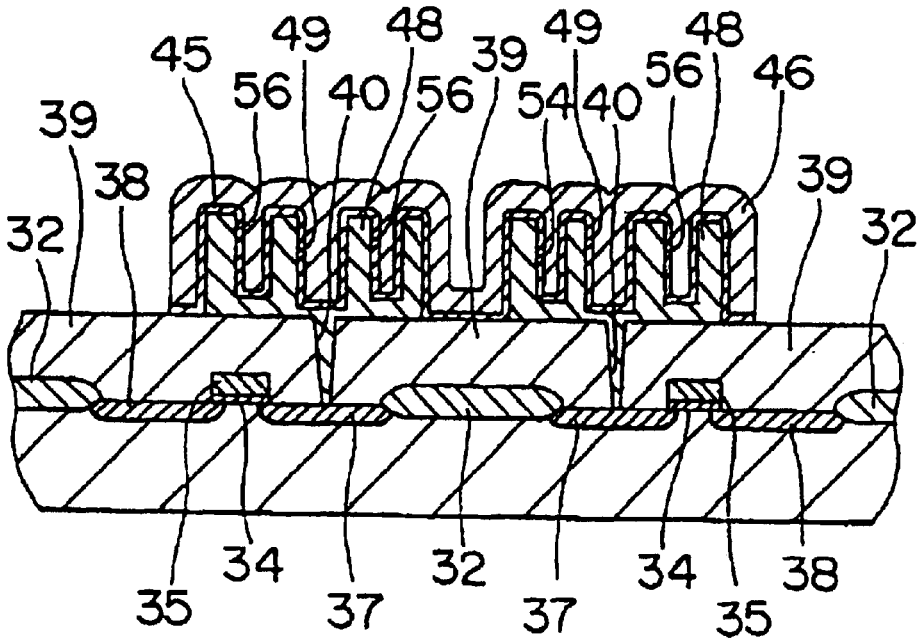

The polysilicon film 46 having a thickness of about 1,500 Å and serving as an upper electrode of the stacked capacitor cells is formed on the dielectric film 45 by CVD and patterned together with the dielectric film 45, thereby completing a stacked capacitor cell structure including the lower electrodes 48, the dielectric film 45, and the polysilicon film 46 as an upper electrode as shown in FIG. 14C.

Figure 14D:
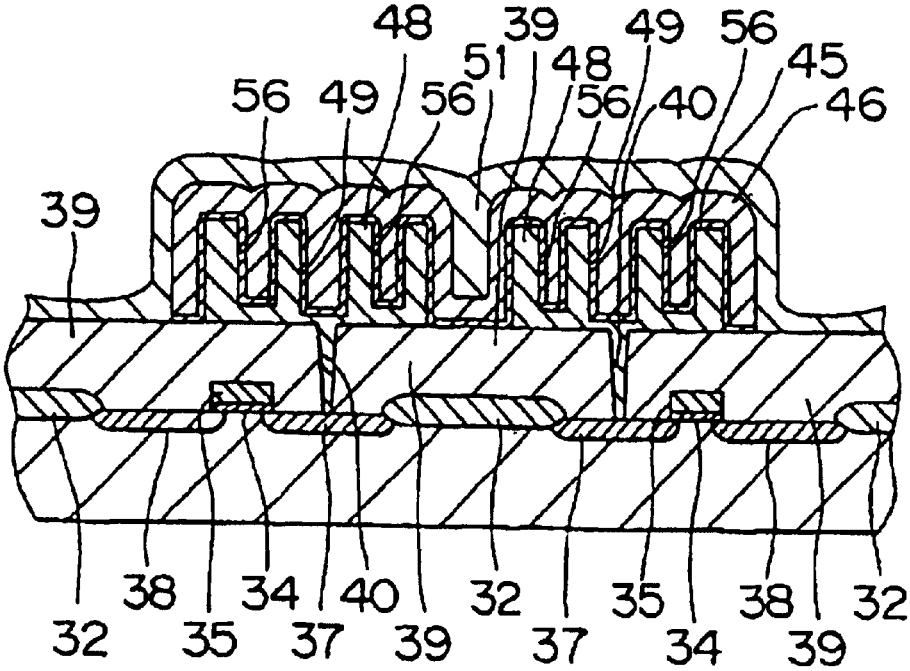
Figure 14E:
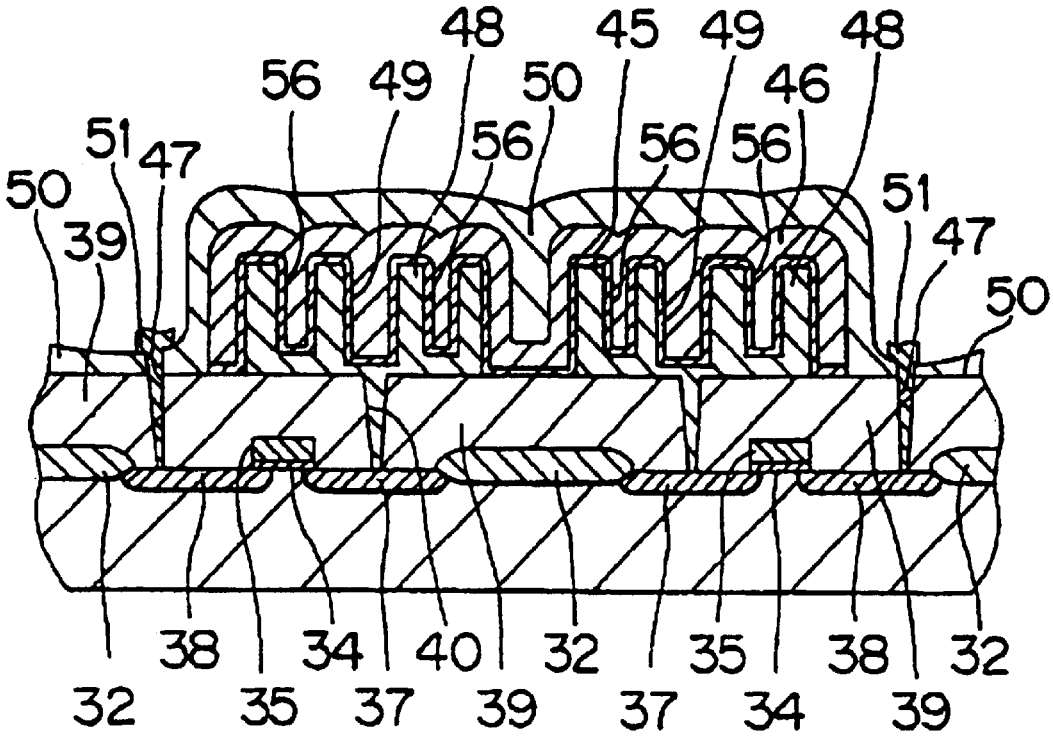
Figure 15:
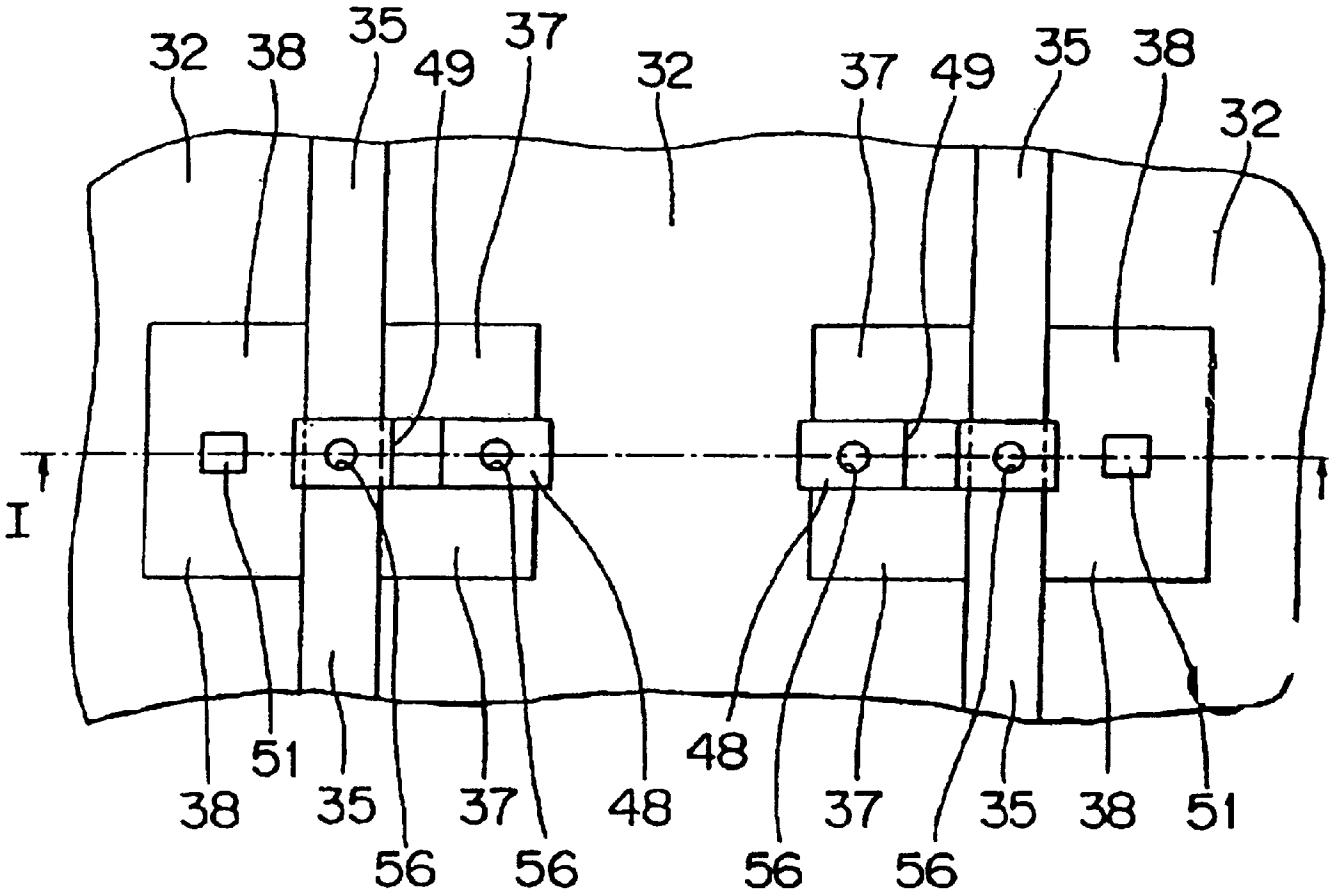
FIG. 15 is a schematic plan view showing the stacked capacitor cell structure DRAM according to the modification of the third embodiment shown in FIGS. 14A to 14E.

Subsequently, as shown in FIG. 14D, the BPSG film 50 is formed on the entire surface and subjected to reflow, and the contact holes 47 are formed to expose portions of the drain regions 38. Thereafter, the aluminum alloy film 51 as a bit line is filled in the contact holes 47 and deposited on the BPSG film by sputtering. Finally, the aluminum alloy film 51 is patterned to complete a stacked capacitor cell structure DRAM as shown in FIGS. 14E and 15.

Note that in the third embodiment, a photoresist 6 may also be formed after the surface of a polysilicon film 5 is planarized as in the second embodiment. If this is the case, recesses can be formed in lower electrodes of capacitors without using the microloading effect as in the second embodiment. Additionally, since photolithography is performed by forming the photoresist 6 on the planarized polysilicon film 5, the widths of the photoresist openings 43 and 44 can be set with higher controllability.

In the second and third embodiments, an element isolation structure can be formed by a field shield structure or a trench element isolation structure.

In the first to third embodiments, a silicon oxide film or an ONO film is used as a dielectric film. However, a dielectric film is not restricted to these films. For example, a ferroelectric film may also be used.

If a ferroelectric film is used, the polysilicon film 5, 11 can be replaced with a film made of platinum, a titanium compound, a tungsten compound or a ruthenium compound. It may also be formed of a double layer structure in which a conductive film made of, for example, poly-silicon is provided under a platinum film.

Any material having a ferroelectric characteristic can be used as a material of the above-mentioned ferroelectric film. For example, PZT(lead zirconate titanate), PLZT(lead lanthanum zirconate titanate), barium titanate, palladium titanate, barium strontium titanate and bismuth titanate can be used as the material of the ferroelectric film. A dielectric film made of, for example, tantalic oxides or $Ta_2O_5$BSTO, which has a high dielectric constant of more than 50, can be used instead of the ferroelectric film.

The third embodiment described above may also be applied to a multi-value DRAM having three or more values. For example, methods of read and write to multi-value DRAMs are described in Japanese Patent Laid-Open No. 60-239994.

Furthermore, an insulating film including a silicon nitride film or an insulating film including a silicon oxide film and a silicon nitride film may be used as a charge storage film.

What is claimed is:

1. A method of fabricating a semiconductor device, comprising:

the first step of defining an element active region by forming an element isolation structure on a semiconductor substrate;

the second step of forming an insulating film on said semiconductor substrate in said element active region;

the third step of forming a first conductive film on an entire surface of said semiconductor substrate including said insulating film, and said element isolation structure;

the fourth step of forming a mask pattern having first and second openings on said first conductive film;

the fifth step etching said first conductive film until said element isolation structure is exposed in said first opening by using said mask pattern as a mask, thereby dividing said first conductive film, and simultaneously forming a recess in said second opening where said first conductive film forms a bottom of said recess;

the sixth step of forming a dielectric film so as to cover a surface of said firs conductive film; and the seventh step of forming a second conductive film on said dielectric film opposing said first conductive film through said dielectric film.

2. A method according to claim 1, further comprising, after the seventh step, the eighth step of doping an impurity into said semiconductor substrate in said element active region to form a pair of impurity diffusion layers in surface regions of said semiconductor substrate on two sides of said first conductive film.

3. A method according to claim 1, wherein in the fourth step, said mask pattern is so formed that a width of said first opening is not less than twice a width of said second opening.

4. A method according to claim 1, further comprising, between the third and fourth steps, the ninth step of planarizing said first conductive film by polishing, and wherein in the fourth step, said mask pattern is so formed that said second opening is positioned above said element active region.

5. A method of fabricating a semiconductor device, comprising:

the first step of forming a first conductive film in an insulating film region on a semiconductor substrate;

the second step of forming a mask pattern having first and second openings of different dimensions on said first conductive film;

the third step of etching said first conductive film by using said mask pattern as a mask, thereby dividing said first conductive film conforming to a shape of said first opening so as to reach said insulating film region, and simultaneously forming a cylindrical hole below said second opening in which a surface of said insulating film region is exposed in a surface of said divided first conductive film conforming to a shape of the other opening;

the fourth step of forming an insulating film so as to cover a surface of said first conductive film; and the fifth step of forming a second conductive film so as to cover a surface of said insulating film opposing said first conductive film through said insulating film.

6. A method according to claim 5, wherein in the third step, said recess is so formed as to reach said insulating film region, thereby forming a hole in which a surface of said insulating film region is exposed.

7. A method of fabricating a semiconductor device, comprising:

the first step of defining an element active region by forming an element isolation structure on a semiconductor substrate;

the second step of forming an insulating film on said semiconductor substrate in said element active region;

the third step of forming a first conductive film on an entire surface including said insulating film and said element isolation structure;

the fourth step of forming a mask pattern having at least first and second openings on said first conductive film;

the fifth step of etching said first conductive film until said element isolation structure is exposed in said first and second openings by using said mask pattern as a mask, thereby dividing said first conductive film below said first opening, and simultaneously forming a cylindrical hole extending through said first conductive film below said second opening and said first conductive film is etched until said insulating layer is exposed in said first opening;

the sixth step of forming a dielectric film so as to cover said first conductive film; and the seventh step of forming a second conductive film on said dielectric film and opposing said first conductive film through said dielectric film.

8. A method according to claim 7, further comprising, after the seventh step, the [eight] *eighth* step of doping an impurity into said semiconductor substrate in said element active region to form a pair of impurity diffusion layers in surface regions of said semiconductor substrate on two sides of said first conductive film.

9. A method according to claim 7, further comprising, between the third and fourth steps, the ninth step of planarizing said first conductive film by polishing.

10. A method according to claim 7, wherein in the first step, a field shield element isolation structure in which a shield plate electrode is embedded is formed on said semiconductor substrate.

11. A method of fabricating a semiconductor substrate, comprising:

the first step of defining an element active region by forming an element isolation structure on a semiconductor substrate;

the second step of forming a gate oxide film and a gate electrode on said semiconductor substrate in said element active region;

the third step of doping an impurity into said semiconductor substrate in said element active region to form a pair of impurity diffusion layers in surface regions of said semiconductor substrate on two sides of said gate electrode;

the fourth [stop] *step* of forming an insulating interlayer on an entire surface of said semiconductor substrate;

the fifth step of forming a hole in said insulating interlayer in which one of said impurity diffusion layers is exposed;

the sixth step of forming a first conductive film on said insulating interlayer which fills said hole electrically connected to one of said impurity diffusion layers;

the seventh step of forming a mask pattern having at least first and second openings on said first conductive film;

the eighth step of etching said first conductive film by using said mask pattern as a mask, thereby dividing said first conductive film below said first opening, and simultaneously forming a cylindrical hole extending through said first conductive film below said second opening, said first conductive film is etched until said insulating interlayer is exposed in said first opening;

the ninth step of forming a dielectric film so as to cover a surface of said first conductive film; and the tenth step of forming a second conductive film so as to cover said dielectric film opposing said first conductive film through said dielectric film.

12. A method according to claim 11, further comprising, between the sixth and seventh steps of planarizing said first conductive film by polishing.

13. A method according to claim 11, wherein in the first step, a field shield element isolation structure in which a shield plate electrode is embedded is formed on said semiconductor substrate.

*14. A method of fabricating a semiconductor device, comprising:*

*forming a conductive film on a surface of an element isolation structure formed on a semiconductor substrate and on a surface of an insulating film formed in element active regions defined by the element isolation structure;*

*forming a mask pattern having at least first and second openings on the first conductive film; and*

*etching the conductive film until the element isolation structure is exposed through the first opening in the mask pattern, and simultaneously etching the conductive film through the second opening in the mask pattern to form a recess in which the conductive film forms a bottom of the recess.*

*15. The method of claim 14, further comprising forming a dielectric film on a surface of the conductive film.*

*16. The method of claim 15, further comprising forming a second conductive film on a surface of the dielectric film.*

*17. The method of claim 16, wherein the second conductive film opposes the conductive film through the dielectric film.*

*18. The method of claim 14, further comprising doping an impurity into the semiconductor substrate in the element active regions to form a pair of impurity diffusion layers in surface regions of the semiconductor substrate on two sides of the conductive film.*

*19. The method of claim 14, wherein the mask pattern is formed so that a width of the first opening is not less than twice a width of the second opening.*

*20. The method of claim 14, further comprising planarizing the conductive film by polishing after forming the conductive film.*

*21. The method of claim 14, further comprising forming the mask pattern so that the second opening is positioned above at least one of the element active regions.*

*22. A method of fabricating a semiconductor device, comprising:*

*forming a conductive film on a surface of an element isolation structure formed on a semiconductor substrate and on a surface of an insulating film formed in element active regions defined by the element isolation structure;*

*forming a mask pattern having at least first and second openings on the conductive film; and*

*etching the conductive film until the element isolation structure is exposed through the first opening in the mask pattern, and simultaneously etching the conductive film through the second opening in the mask pattern to form a cylindrical hole in the conductive film below the second opening.*

*23. The method of claim 22, further comprising simultaneously etching the conductive film through a third opening in the mask pattern to form a recess in which the conductive film forms a bottom of the recess.*

*24. The method of claim 22, further comprising forming a dielectric film on a surface of the conductive film.*

*25. The method of claim 24, further comprising forming a second conductive film on a surface of the dielectric film.*

*26. The method of claim 22, further comprising etching the conductive film so that the cylindrical hole formed below the second opening exposes the element isolation structure.*

*27. The method of claim 22, further comprising etching the conductive film so that a cylindrical recess is formed below the second opening in which the conductive film forms a bottom of the cylindrical recess.*

*28. The method of claim 22, further comprising planarizing the conductive film by polishing after forming the conductive film.*

*29. A method of fabricating a semiconductor device, comprising:*

*forming a gate electrode in an element active region defined by an element isolation structure formed on a semiconductor substrate;*

*doping an impurity into the semiconductor substrate in the element active region to form a pair of impurity diffusion layers in surface regions of the semiconductor substrate on two sides of the gate electrode;*

*forming an insulating interlayer on a surface of the element active region and a surface of the element isolation structure;*

*forming a hole in the insulating interlayer in which one of the impurity diffusion layers is exposed;*

*forming a conductive film on a surface of the insulating interlayer, wherein the conductive film fills the hole to electrically connect to the impurity diffusion layer;*

*forming a mask pattern having at least first and second openings on the conductive film; and*

*etching the conductive film until the insulating interlayer is exposed through the first opening in the mask pattern, and simultaneously exposing the insulating interlayer by etching the conductive film through the second opening in the mask pattern to form a cylindrical hole* [in the conductive film] *below the second opening.*

*30. The method of claim 29, further comprising simultaneously etching the conductive film through a third opening in the mask pattern to form a recess in which the conductive film forms a bottom of the recess.*

*31. The method of claim 29, further comprising forming a dielectric film on a surface of the conductive film.*

*32. The method of claim 31, further comprising forming a second conductive film on a surface of the dielectric film.*

*33. The method of claim 29, further comprising planarizing the conductive film by polishing after forming the conductive film.*

* * * * *

UNITED STATES PATENT AND TRADEMARK OFFICE

CERTIFICATE OF CORRECTION

PATENT NO. : RE42,004 E
APPLICATION NO. : 11/655744
DATED : December 21, 2010
INVENTOR(S) : Sugaya It is certified that error appears in the above-identified patent and that said Letters Patent is hereby corrected as shown below:

Column 1, line 11, delete "Apr. 4, 1998" and insert --Apr. 14, 1998--.

Column 17, line 31, in Claim 1, delete "firs" and insert -- first --.

Column 20, lines 52-53, in Claim 29, after "*cylindrical hole*" delete "[in the conductive film]".

Signed and Sealed this
Twenty-sixth Day of April, 2011

David J. Kappos

David J. Kappos
*Director of the United States Patent and Trademark Office*